United States Patent [19]

Marzalek et al.

[11] Patent Number: 5,162,723
[45] Date of Patent: Nov. 10, 1992

[54] SAMPLING SIGNAL ANALYZER

[75] Inventors: Michael S. Marzalek, Petaluma; Richard C. Keiter, Healdsburg; John A. Wendler, Santa Rosa; Stephen R. Peterson, Santa Rosa; Ronald J. Hogan, Santa Rosa, all of Calif.

[73] Assignee: Hewlett-Packard Company, Palo Alto, Calif.

[21] Appl. No.: 654,451

[22] Filed: Feb. 11, 1991

[51] Int. Cl.⁵ .............................. G01R 23/02
[52] U.S. Cl. ....................... 324/77 B; 324/121 R; 324/78 F; 324/78 E; 324/78 D; 455/295; 364/485
[58] Field of Search ............ 364/485, 484; 455/330, 455/295; 324/78 F, 78 D, 77 B, 121 R, 83 D, 78 E

[56] References Cited

U.S. PATENT DOCUMENTS

| | | | |
|---|---|---|---|
| 3,876,946 | 4/1975 | La Clair | 364/485 |
| 3,983,379 | 9/1976 | Scott | 364/485 |
| 4,245,355 | 1/1981 | Pascoe | 455/330 |
| 4,270,209 | 5/1981 | Albanese | 364/485 |
| 4,686,457 | 8/1987 | Banno | 324/77 B |
| 4,890,237 | 12/1989 | Bales | 364/485 |
| 4,928,251 | 5/1990 | Marzalek | 324/78 Q |
| 4,983,906 | 1/1991 | Hiller | 364/484 |

Primary Examiner—Kenneth A. Wieder
Assistant Examiner—Jose M. Solis
Attorney, Agent, or Firm—William C. Milks, III

[57] ABSTRACT

A sampling signal analyzer in which the frequency of an input signal to be measured is initially ascertained, an appropriate sampling frequency is then determined, data needed to reconstruct the wave form of the input signal is acquired, and the input signal wave shape is reconstructed with a calibrated time axis and preferably displayed. The sampling signal analyzer synthesizes a sampler drive signal to enable continuous sampling of the input signal and therefore has the advantage over known data sampling signal measurement instruments that it is not triggered directly in response to the level of the input signal to be measured. Instead, sample timing is based on numerical analysis of the intermediate frequency (IF) signal produced by the sampler. The IF frequency can be an arbitrarily low frequency, which allows digitizing and digital signal processing for aligning measurement data from sweep to sweep with precision. The sampling signal analyzer operates so that all frequency components of the input signal will lie within plus or minus an IF bandwidth away from a comb tooth of a sampling frequency and will translate (i.e., mix) and compress into the IF. The sampling signal analyzer determines where to mix the input signal in the IF based on the frequency of the input signal and a display time range selected by the operator. The number of cycles of the wave form being displayed can be selected by the operator, and the time axis is automatically rescaled to display the selected number of cycles, notwithstanding a change in the input signal frequency. A pulse profiling method enables the recoverable modulation bandwith of the sampling signal analyzer to be as wide as a high-frequency input bandwidth so that the response of high-frequency devices stimulated by pulsed or otherwise modulated signals can be measured.

21 Claims, 22 Drawing Sheets

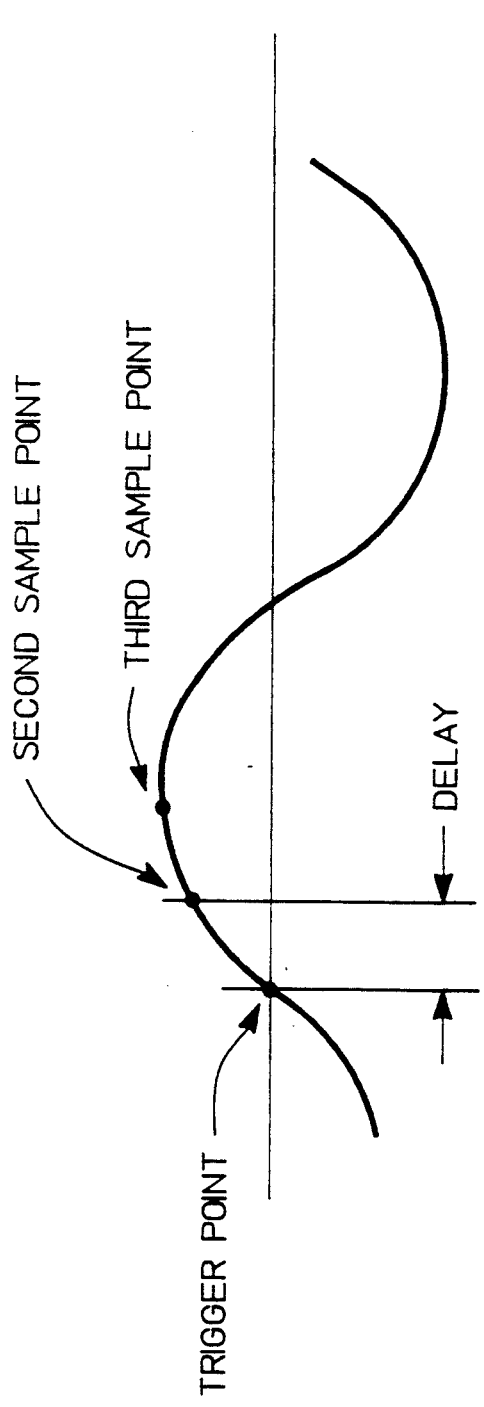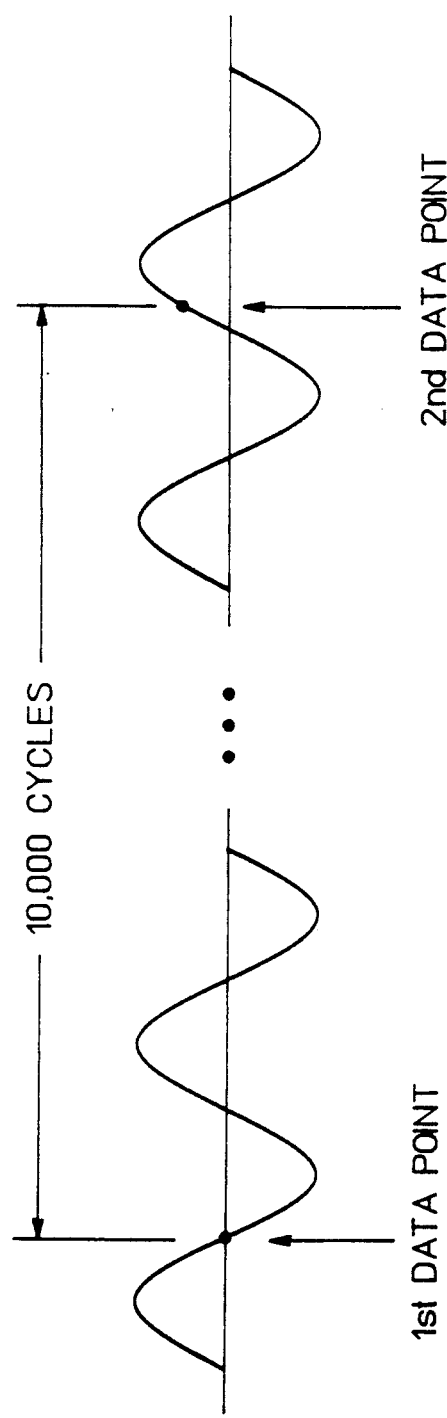

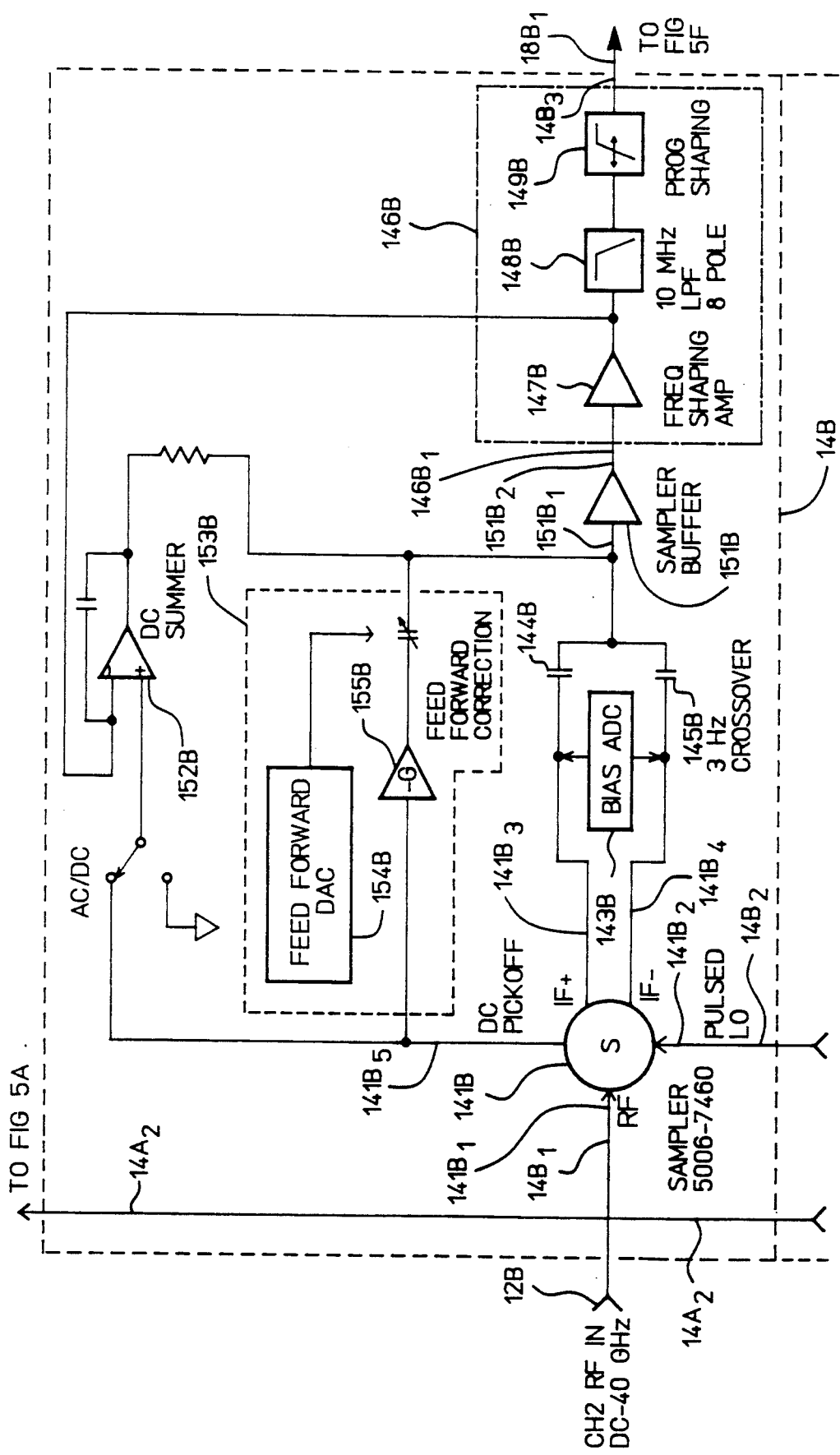

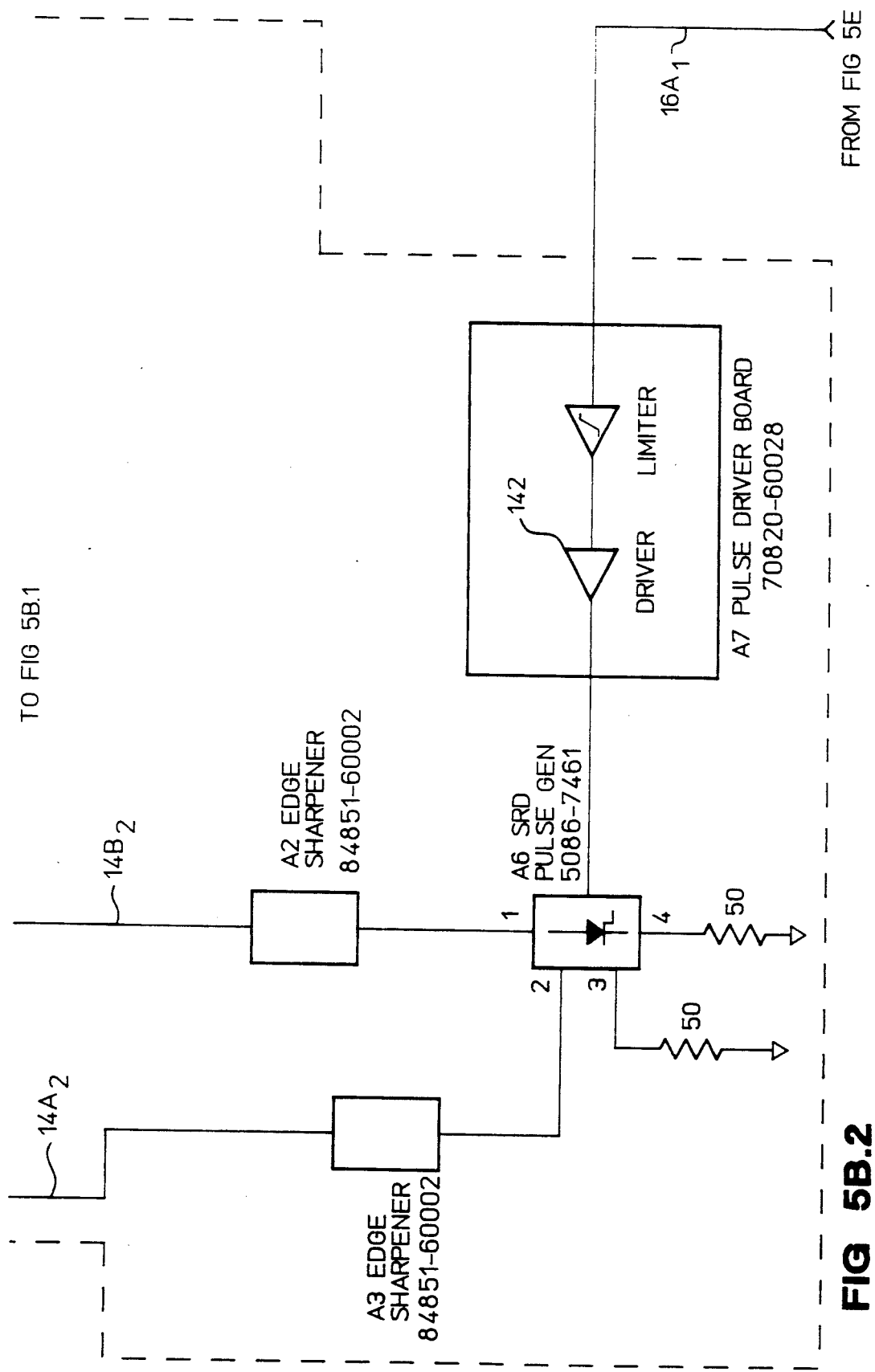
FIG 5B.2

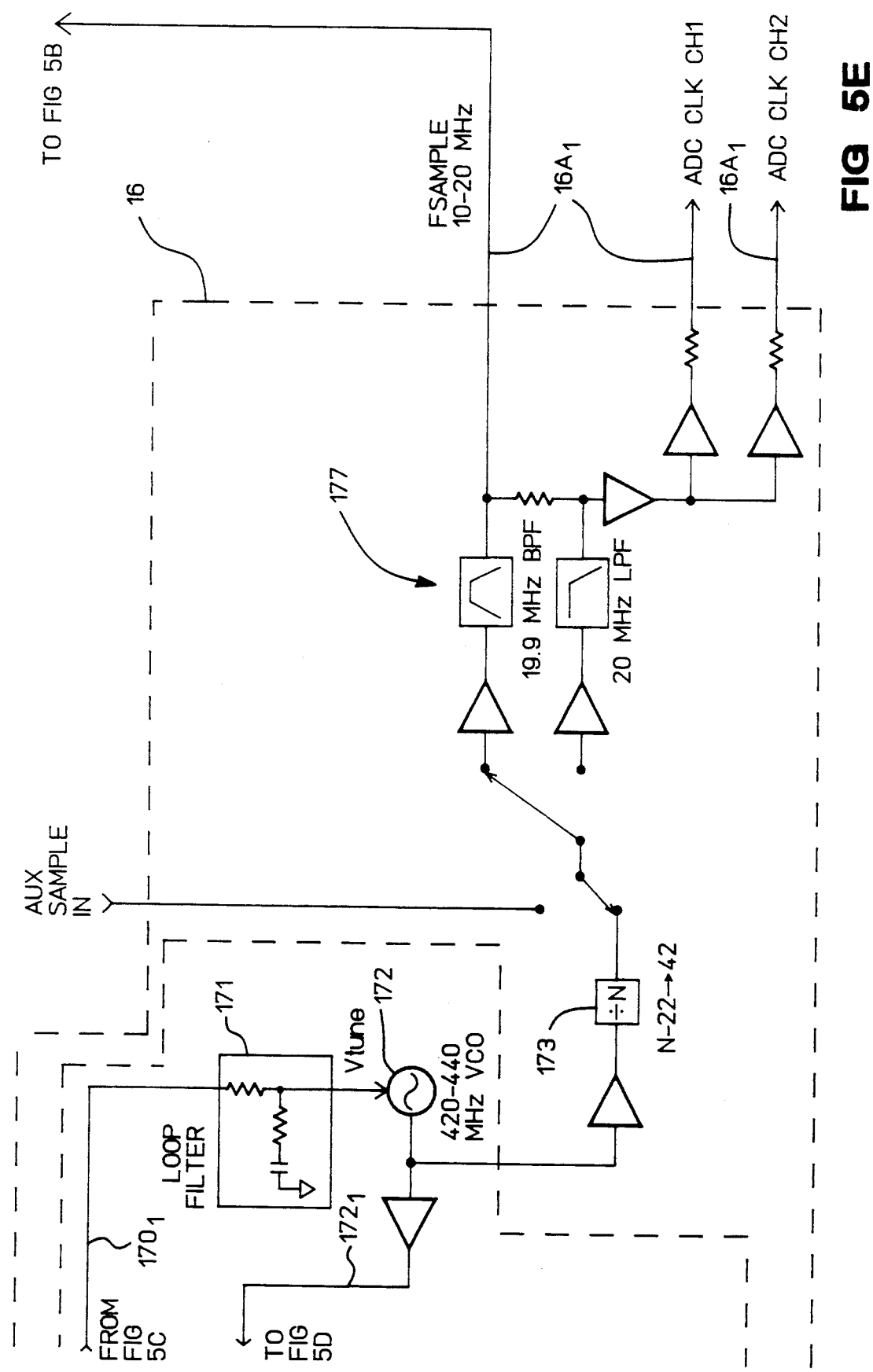

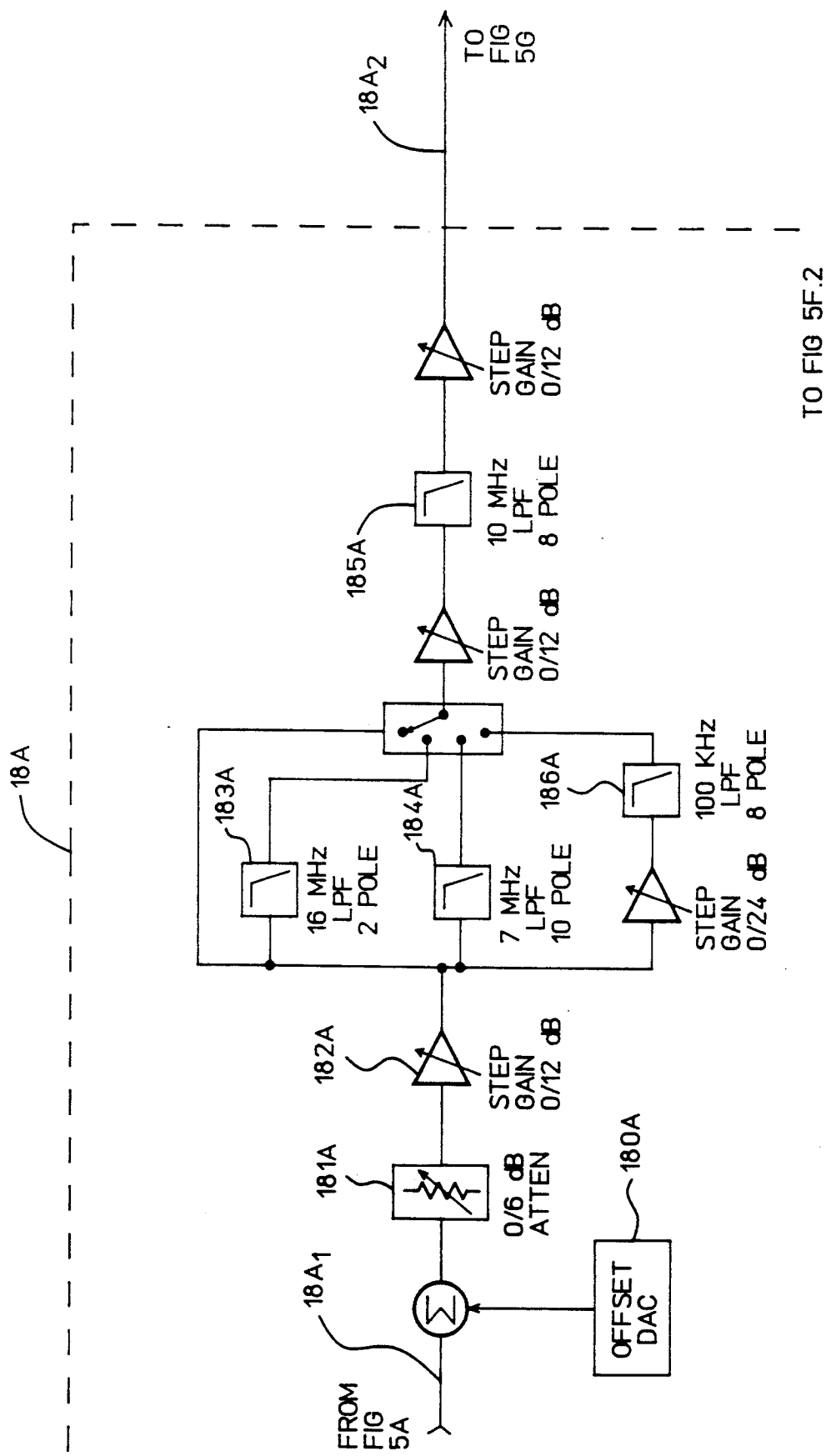
FIG 5F.1

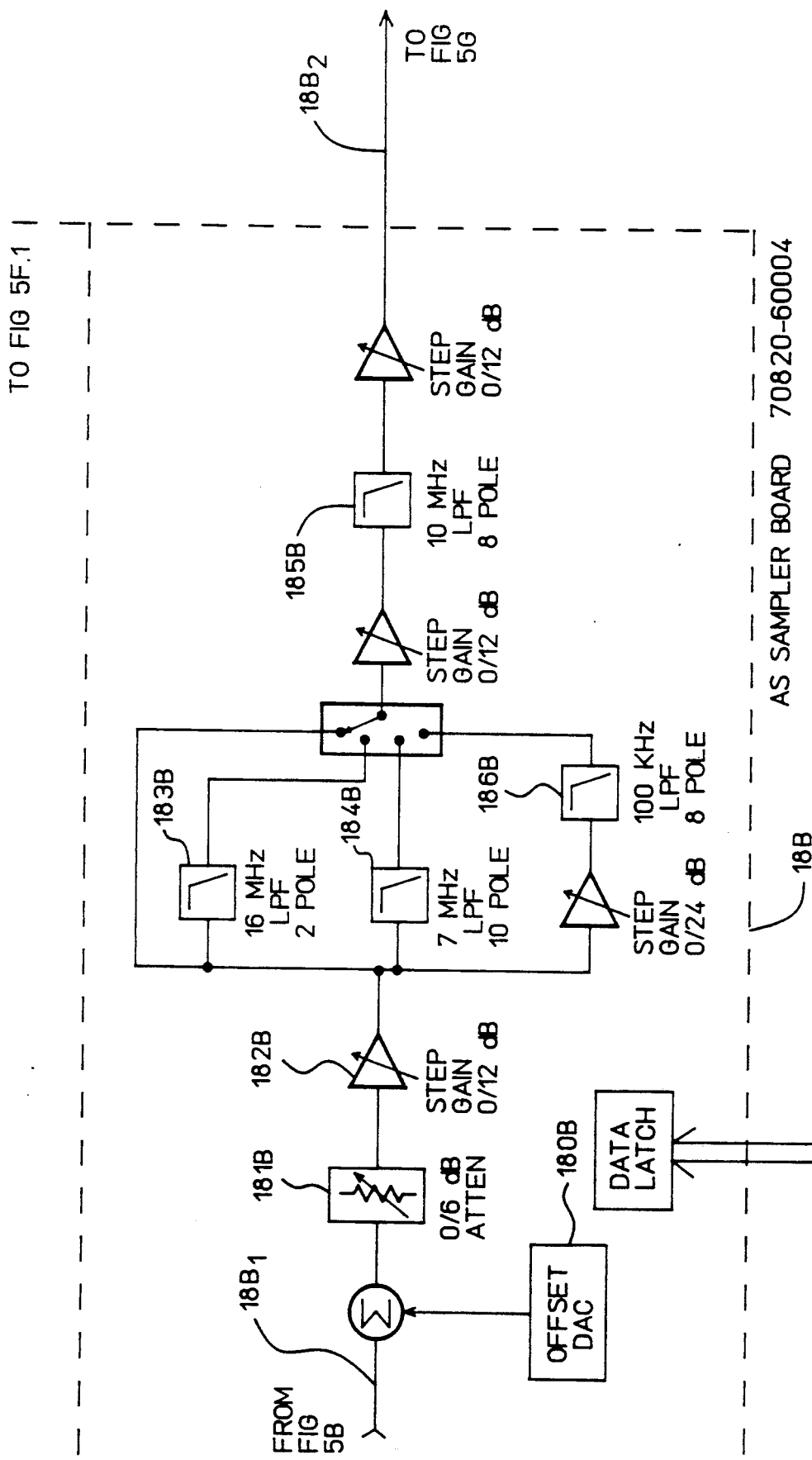
FIG 5F.2

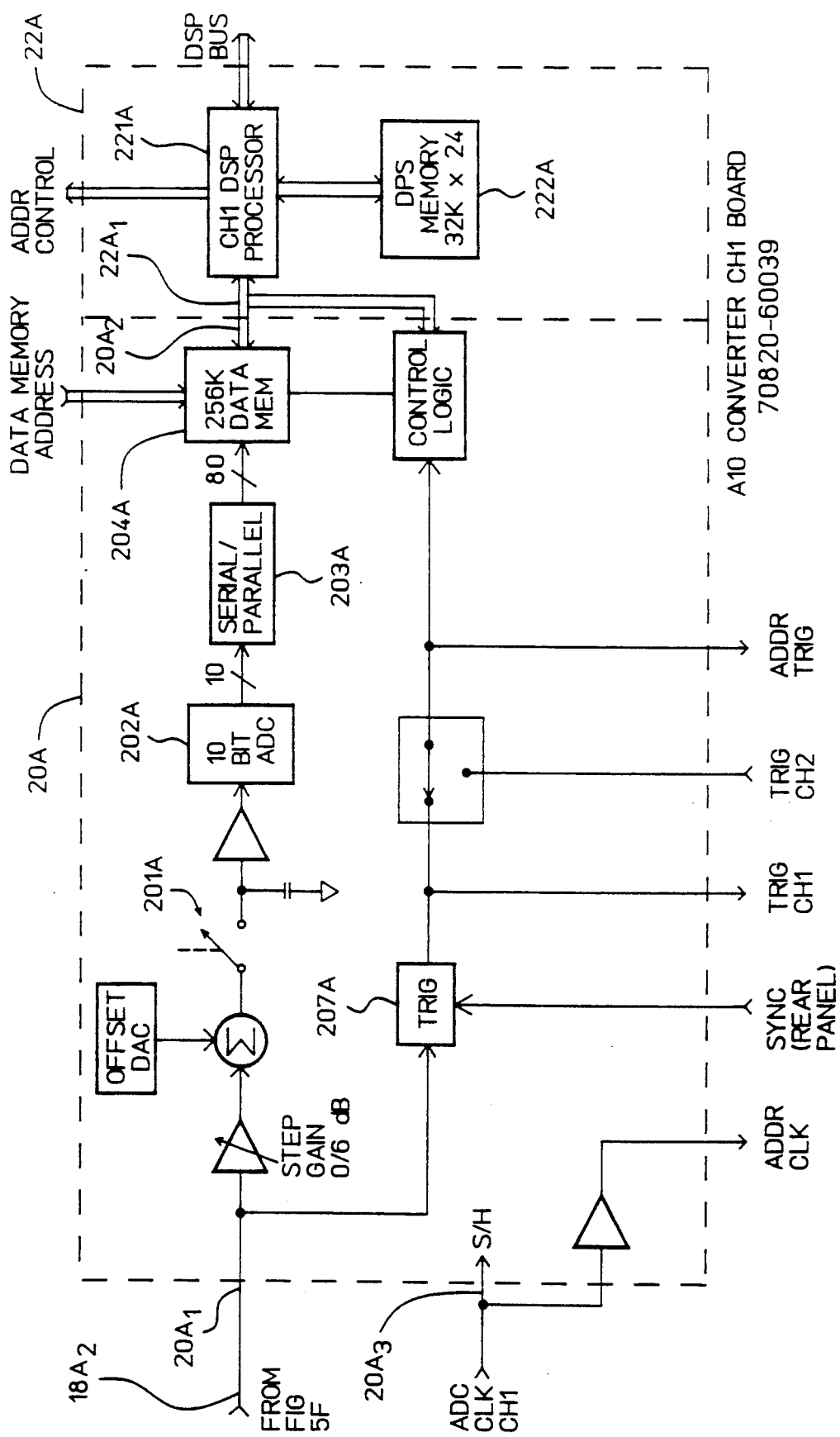
FIG 5G.1

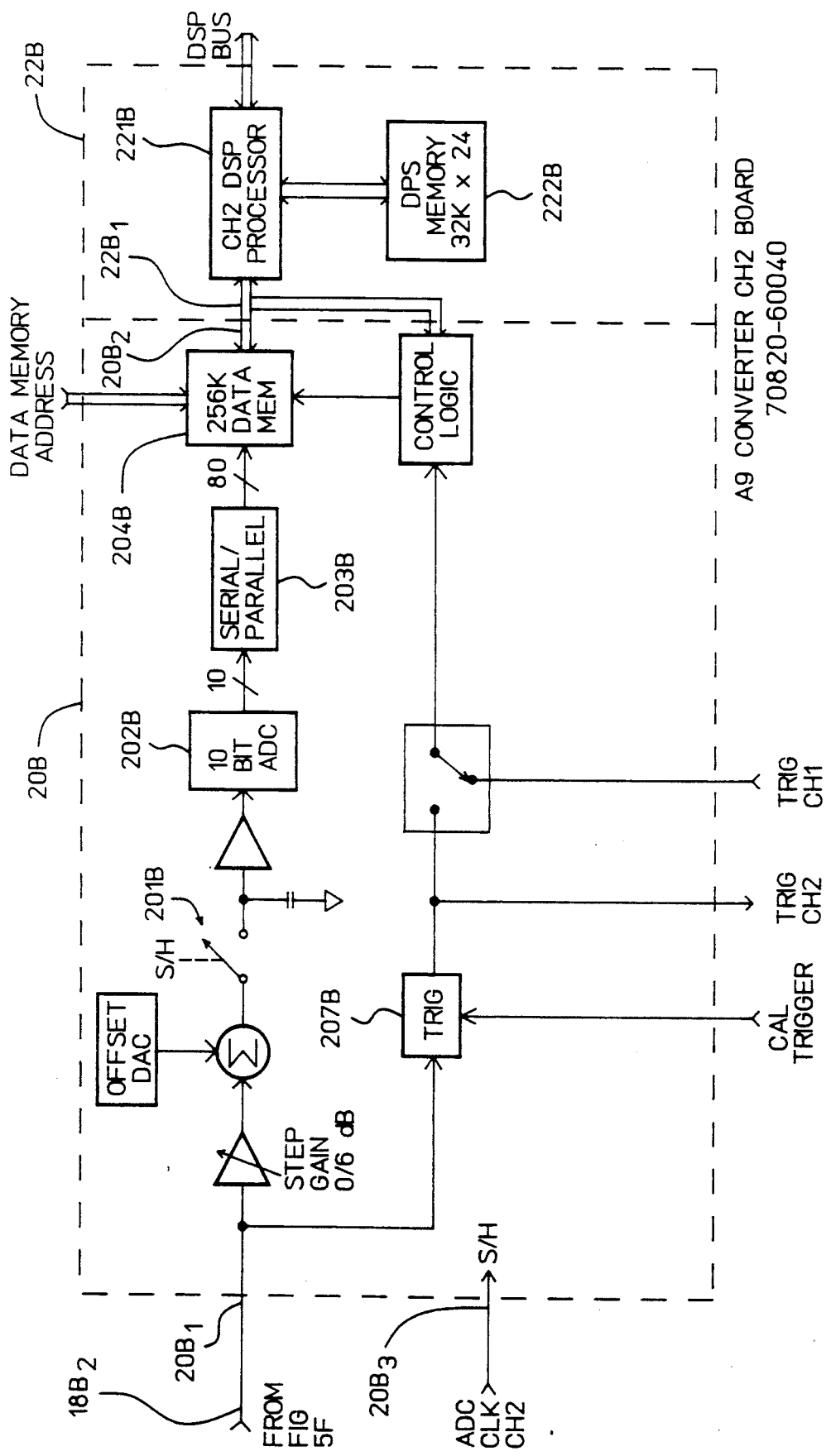
FIG 5G.2

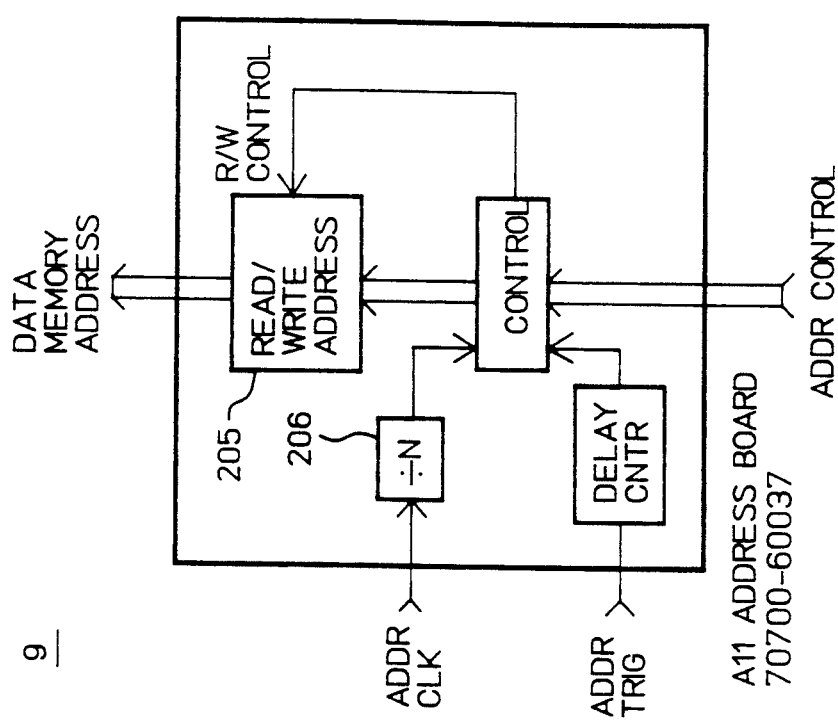
FIG 5H.2
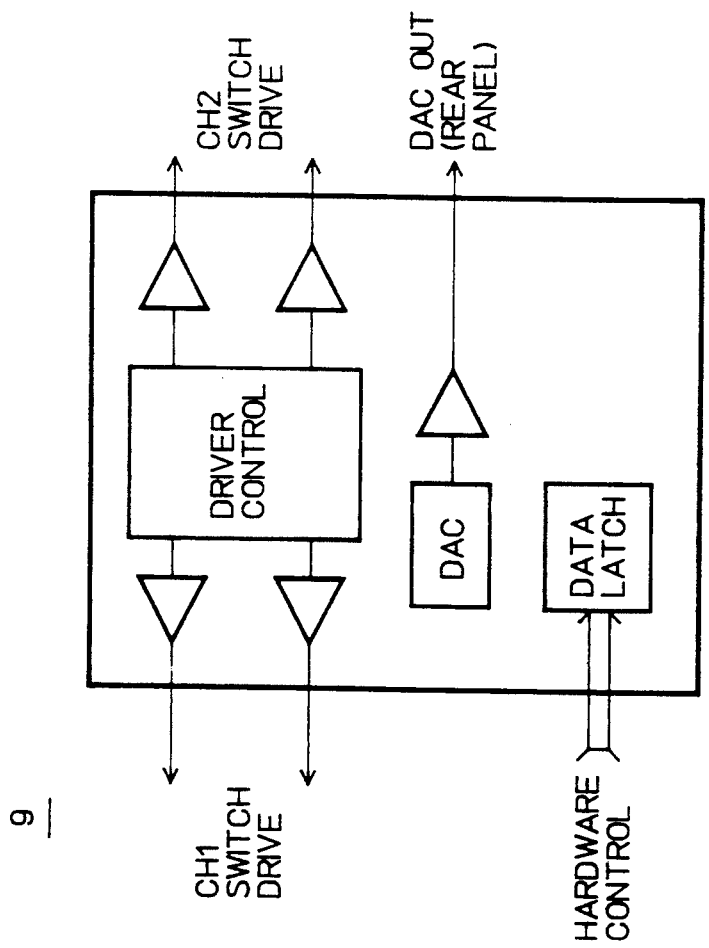
FIG 5H.1

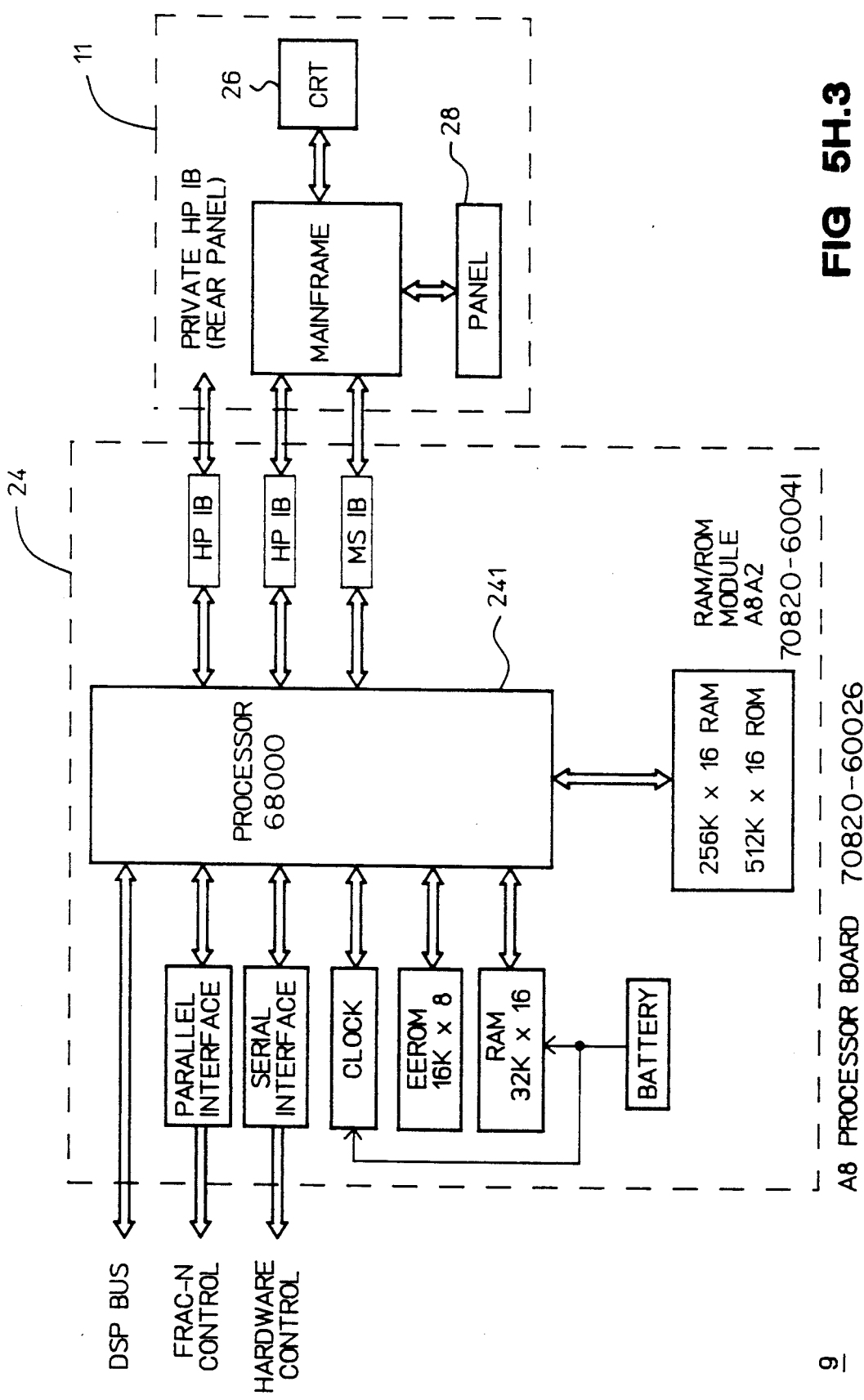
FIG 5H.3

5,162,723

SAMPLING SIGNAL ANALYZER

REFERENCE TO MICROFICHE APPENDIX

A microfiche appendix, comprising Appendices A, B, and C, appears in the application file. The microfiche appendix consists of three microfiche and 98 frames.

BACKGROUND OF THE INVENTION

This invention relates to test and measurement instruments and, more particularly, to methods and apparatus for sampling and replicating the wave forms of electrical signals. Specifically, the invention is directed to a sampling signal analyzer for measuring, i.e., sampling and reconstructing for display, the non-transient or slowly-changing components and composite wave shape of an input signal based on ascertaining the frequency of the input signal and internally synthesizing an appropriate sampler drive signal, thereby obviating the need for a traditional high-speed trigger circuit responsive directly to the level of the input signal.

Heretofore, power meters have been used to measure the power of an input signal. Counters have been used to measure the fundamental frequency of an input signal. Spectrum analyzers have been used to measure the fundamental frequency and magnitude of an input signal and any harmonics that are present. However, none of these instruments has the capability of displaying the time domain (voltage versus time) wave shape of the input signal being measured.

In connection with measurement and display of non-transient or slowly-changing components and composite wave shape of an input signal, such as signals above 1 GHz, there is a need to record and examine fast rise-time (or fast fall-time) characteristics. One technique employed in the past is direct measurement of these input signals. Direct measurement requires an input signal trigger. Unfortunately, triggering in response to the level of the input signal is limited by the sensitivity and frequency response of the trigger circuit. Analog oscilloscopes used in the past have well-known problems associated with triggering in response to the level of the input signal, most notably being the trigger level sensitivity, trigger bandwidth, and trigger jitter. In general, the technology of triggering has not kept pace with that of sampling.

With regard to sampling, various data sampling instruments are known. For example, the block diagram of a typical sequential sampling digitizing oscilloscope is shown in FIG. 1. The sequential sampling digitizing oscilloscope is an architecture used to achieve high bandwidth.

In order to acquire measurement data, an input signal having a period T shown in FIG. 1 is routed through two separate electrical paths, namely, a high-frequency (HF) trigger circuit and a sampler circuit. The trigger circuit provides the correct timing of the sampler drive pulse relative to the level of the input signal. Once a trigger event is detected, an incremental delay circuit can delay for a short time before triggering the actual sampler drive pulse. Initially, however, triggering is not typically delayed, and the sampler drive pulse is generated directly from the trigger event in order to initiate acquisition of the first sample. Accordingly, the sampler circuit is enabled for a brief period of time and feeds a sampled analog voltage to an analog-to-digital converter (ADC). The digitized voltage is then processed by a microprocessor circuit and displayed on a display screen.

To summarize, the following is the sequence of events which occurs when a single sampled data point is acquired by the sequential sampling digitizing oscilloscope shown in FIG. 1. The input signal must satisfy a predetermined trigger condition. If so, a trigger pulse is generated by the HF trigger circuit. The sampler drive circuit enables the sampler circuit. Then, the output of the sampler circuit is digitized by the ADC. This sequence requires a finite length of time, for example, 0.1 millisecond. Accordingly, such sequential sampling digitizing oscilloscopes are constrained by the absolute speed limitations of the circuitry.

Furthermore, in order to display a wave form, more than one sampled data point is required. Therefore, the foregoing sequence is repeated with the following modifications. After the initially sampled data point has been digitized, the incremental delay circuit provides a delay after the trigger condition is again met. FIG. 2 shows how this modification will effect the sampling of the next data point. As shown in FIG. 2, each time that the delay time is lengthened, a new data point on the input signal wave form will be sampled. In fact, the delay time must be lengthened, or the same point of a steady-state periodic wave form will be repetitively sampled, which would mean that the wave shape could not be reproduced.

In view of the preceding discussion, the data acquisition operation of a sequential sampling digitizing oscilloscope can be characterized as triggering at a specific input signal level and then sampling the input signal in order to acquire the initial sampled data point. In order to acquire the next sampled data point, the sequential sampling digitizing oscilloscope triggers at the same level, but delays for a longer time and then samples the input signal.

The HF trigger circuit is instrumental in performing data acquisition. As each sampled data point is obtained, the wave shape of the input signal is progressively reconstructed.

However, in the case of sequential sampling digitizing oscilloscopes, the internal clock frequency can be, for example, 100 MHz. Generally, it must be determined when an asynchronous trigger occurs to a precision of about two percent of the input signal period. For an input signal frequency of 20 GHz, the triggering accuracy must be 1.0 picosecond, which is one part in 10,000 of the exemplary internal clock period. This accuracy is difficult to achieve.

Also, several cycles of the input signal wave form may occur between each sampled data point during the data acquisition process. For example, suppose that the sequential sampling digitizing oscilloscope receives a 100 MHz sine wave input signal. In the given example, approximately 0.1 millisecond is required to sample and digitize each data point. This means that the time between the first and second sampled data points is 0.1 millisecond. Since the period of a 100 MHz sine wave is 0.1E-7 second, 1E4 cycles of the input signal will occur between each of the data points, as shown in FIG. 3. Any change which occurs in the wave shape of the input signal during 10,000 cycles may not be measured.

Therefore, sequential sampling digitizing oscilloscopes are clearly limited, since they can require circuitry required to operate at speeds comparable to or higher than the input signal to be measured. Since this is not always possible, because of limitations of the speed of available data acquisition and digitizing circuitry, an alternative is needed to the traditional triggered sampled data acquisition process.

Also in the past, an instrument manufactured by Hewlett-Packard Company, headquartered in Palo Alto, CA, under the model designation HP 54100 has employed random repetitive data sampling, whereby triggered samples of a repetitive wave form are acquired every 25 nanoseconds if a given trigger level is reached. A trigger interpolator circuit determines where each sampled data point has occurred with respect to the trigger, i.e., whether it occurred before the trigger or after the trigger, and by how much before or after the trigger it occurred. Based on where the sampled data point occurred with respect to the trigger, a dot representing the position of the sampled data point in a voltage versus time relationship is directed to an output device, such as a sequential sampling digitizing oscilloscope display screen or a printer, where the dot is stored and/or displayed as an element of a reconstructed or synthesized wave shape. Due to the inherent shortcomings with respect to the accuracy of triggering in response to the level of an input signal, however, there is a limitation on the accuracy of such a synthesized wave form at high frequencies.

Finally, digital signal processing can be used to derive the frequency of an input signal from sampled data points, and the wave shape can be replicated, as described in U.S. Pat. No. 4,928,251. In accordance with the disclosure in this patent, representations of signal edges of a repetitive input signal being measured are sampled, next sorted out based on frequency and sequence, and then superimposed along a common time base of one period in order to reconstruct the input signal. More specifically, a string of samples of a repetitive input signal with high-frequency components is acquired with relatively low time resolution to determine an approximate wave shape from the low resolution samples, then digital signal processing, preferably in the form of a fast Fourier transform, is applied to a reconstructed time record of the input signal to obtain an accurate fundamental frequency, and finally the sampled wave form is reconstructed by overlaying sampled components with reference to a common time or phase reference. Further processing, for example, bin interpolation based on a window function, as described in U.S. Pat. No. 4,686,457, can be employed to improve the estimate of the fundamental frequency. Using values representing hundreds of samples of the input signal, it is possible to determine the wave shape, as well as its frequency, to an accuracy in excess of known trigger-based sampling techniques. However, this requires a substantial amount of data acquisition and digital signal processing capability.

SUMMARY OF THE INVENTION

One embodiment of the present invention provides a sampling signal analyzer in which the frequency of an input signal to be measured is initially ascertained, an appropriate sampling frequency is then determined, data needed to reconstruct the wave form of the input signal is acquired, and the input signal wave shape is reconstructed for display. The sampling signal analyzer comprises means for synthesizing a sampler drive signal to enable continuous sampling of the input signal and therefore has the advantage over known data sampling signal measurement instruments that it is not triggered directly in response to the level of the input signal to be measured. Instead, sample timing is based on numerical analysis of the intermediate frequency (IF) signal produced by the sampler. The IF frequency can be an arbitrarily low frequency, which allows digitizing and digital signal processing for aligning measurement data from sweep to sweep with precision.

In the case that the frequency of the input signal to be measured is unknown, the sampling signal analyzer first must ascertain the frequency of the input signal by determining the frequency components (fundamental and any harmonics) of the input signal using frequency translation and frequency compression, as well as using digital signal processing resident in firmware, to perform input signal frequency identification. This is preferably accomplished by initially setting the IF bandwidth as wide as allowable, then setting the frequency of a sampling signal oscillator, preferably a low-phase-noise fractional-N synthesized source, to a frequency less than twice the IF bandwidth. This assures that all frequency components of the input signal will lie within plus or minus an IF bandwidth away from a comb tooth of the sampling signal oscillator frequency and will translate (i.e., mix) into the IF.

Next, the sampling signal analyzer acquires a first set of measurement data using the sampler and digitizes the sampled data by means of an analog-to-digital converter. The first set of sampled data is preferably subjected to digital signal processing in the form of a fast Fourier transform (FFT), and resulting spectral positions and amplitudes of the signal responses are stored in memory.

Then, the sampling signal oscillator frequency is set to another frequency (still less than twice the IF bandwidth), and a second set of measurement data is acquired. Thereafter, the second set of sampled data is processed by the FFT, and the signal responses are stored in memory.

For example, if the sampling signal oscillator frequency is moved 1 kHz and the IF response consequently moves 300 kHz, then the signal response is conclusively determined to be mixing off the 300th harmonic of the sampling signal oscillator frequency. Based on the direction the IF response moves, it can be determined on which side of the 300th comb tooth that the frequency of the input signal is located.

The frequency (harmonic number times sampling signal oscillator frequency plus or minus the IF frequency) of the input signal is now known. If there are multiple input signals, or many harmonics, or modulation on the input signal, more sets of sampled data and FFT processing are needed to determine how all of the signal responses are interrelated.

The sampling signal analyzer next selects a sampling rate based on the fundamental frequency of the input signal and a display time range selected by the operator. The sampling signal analyzer then generates a sampling signal oscillator frequency which is employed to actually measure the fundamental and any harmonics which comprise the input signal and therefore reconstruct the wave form of the input signal, which can then be displayed. That is, the sampler is driven by the signal produced by the variable frequency sampling signal oscillator.

The sampling signal oscillator frequency is selected so as to cause the fundamental and harmonic frequency components of the input signal to be translated to fundamental and harmonic frequency components of a much lower IF frequency. The higher-frequency spectrum is in effect compressed into the IF spectrum for the particular input signal frequency.

At this juncture, the IF bandwidth can be narrowed so as to retain the translated fundamental and harmonic frequency components and reject signal responses which fall significantly away from any sampling signal oscillator harmonic. This effect is referred to as a "comb bandpass," because the IF passband is effectively replicated at each of the sampling signal oscillator harmonic frequencies. Signals which fall between these effective bandpass elements are rejected by the IF, and will therefore not be digitized and displayed. Using a comb bandpass can be a powerful technique for increasing the signal to noise and removing unwanted contaminating signals.

In summary, the sampling signal analyzer first ascertains what input signal(s) is (are) present. The sampling signal analyzer will perform this automatically, but also preferably allows the operator to enter the frequency of an input signal which he or she desires to measure, for example, for measuring harmonics of a known fundamental input signal frequency. The sampling signal analyzer then selects one of the input signal frequencies and can be commanded by the operator to construct a comb bandpass around it and its harmonics. When the preceding occurs, the entire bandwidth of the input signal, for example, DC to 40 GHz, is accurately compressed into the bandwidth of the IF. Finally, the output of the comb bandpass is preferably displayed. The number of cycles of the wave form being displayed can preferably be selected by the operator, and the time axis is automatically rescaled to display the selected number of cycles, notwithstanding a change in the input signal frequency.

Accordingly, the sampling signal analyzer produces a stable, reconstructed wave form with calibrated time axis for measuring an input signal. The sampling signal analyzer is a frequency selective instrument with sensitivity much better than that of a conventional sequential sampling digitizing oscilloscope. The sampling signal analyzer not only measures small, high-frequency input signals, but does so without requiring a conventional trigger. The sampler is driven by a synthesized sampling signal oscillator whose frequency is determined by the input frequency and the desired time scale setting of the sampling signal analyzer. A trigger circuit operating on the IF signal, or, alternatively, based on a desired phase of the ascertained fundamental frequency of the input signal, is simply used for alignment of measurement data from sweep to sweep and is not required for basic measurement data acquisition.

The sampling signal analyzer enables the response of high-frequency devices stimulated by pulsed or otherwise modulated signals to be measured. A pulse profiling method in accordance with the invention enables recoverable modulation bandwidth of the sampling signal analyzer to be as wide as the high-frequency input bandwidth so that appropriate measurements can be performed.

The sampling signal analyzer is ideal for designing and testing gallium arsenide (GaAs) integrated circuits and other fast logic families, in addition to enabling observation of microwave analog wave forms. It is less expensive to construct than a conventional sequential sampling digitizing oscilloscope, because it does not require a trigger circuit directly responsive to the level of the input signal being measured.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 2 illustrates sampling of an input signal by the sequential sampling digitizing oscilloscope shown in FIG. 1;

FIG. 3 illustrates the occurrence of multiple cycles of a high-frequency input signal between sampling by the sequential sampling digitizing oscilloscope shown in FIG. 1;

FIG. 5, comprising FIGS. 5A through 5H, is a schematic circuit diagram of the microwave transition analyzer system shown in FIG. 4;

FIG. 10, comprising

DETAILED DESCRIPTION OF THE PREFERRED EMBODIMENTS

One embodiment of the present invention provides a microwave sampling signal analyzer. The sampling signal analyzer is preferably incorporated into an HP 70000 modular measurement system available from the Signal Analysis Division of Hewlett-Packard Company, Rohnert Park, CA, to form a microwave transition analyzer system, as will now be described.

Figure 1:
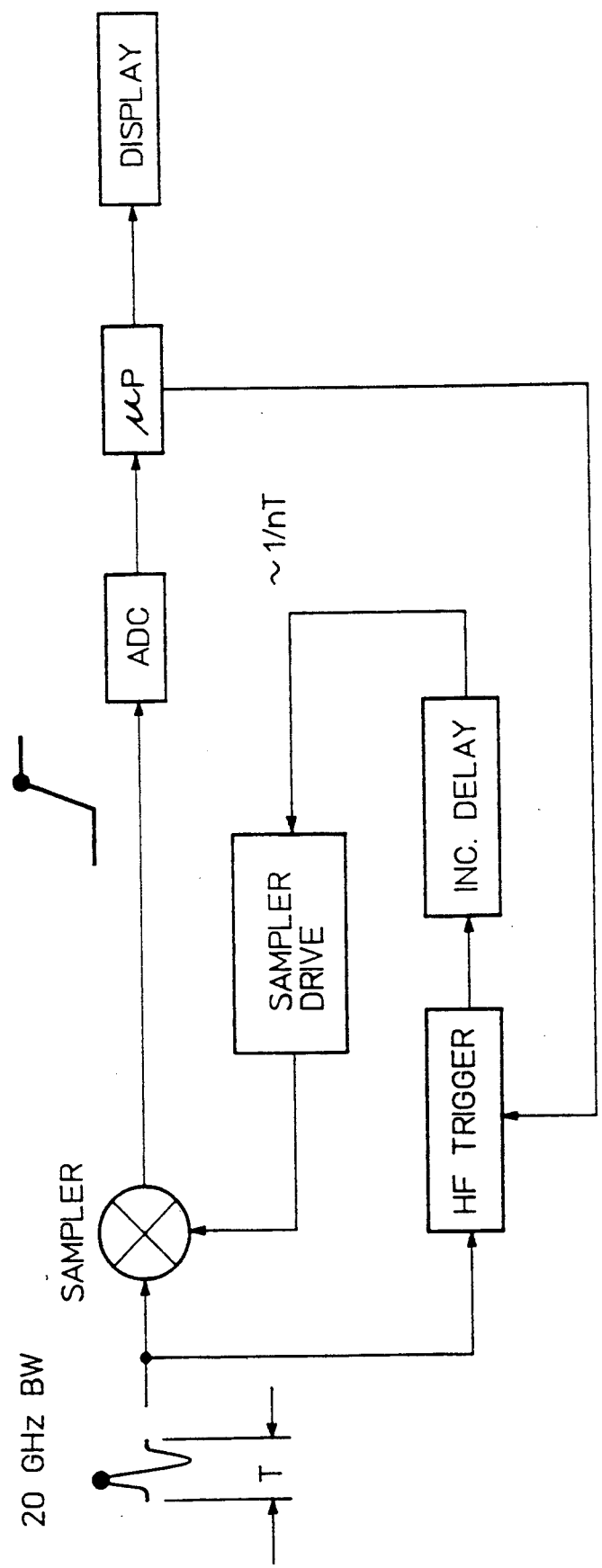
FIG. 1 is a block diagram of a known sequential sampling digitizing oscilloscope.
Figure 4:
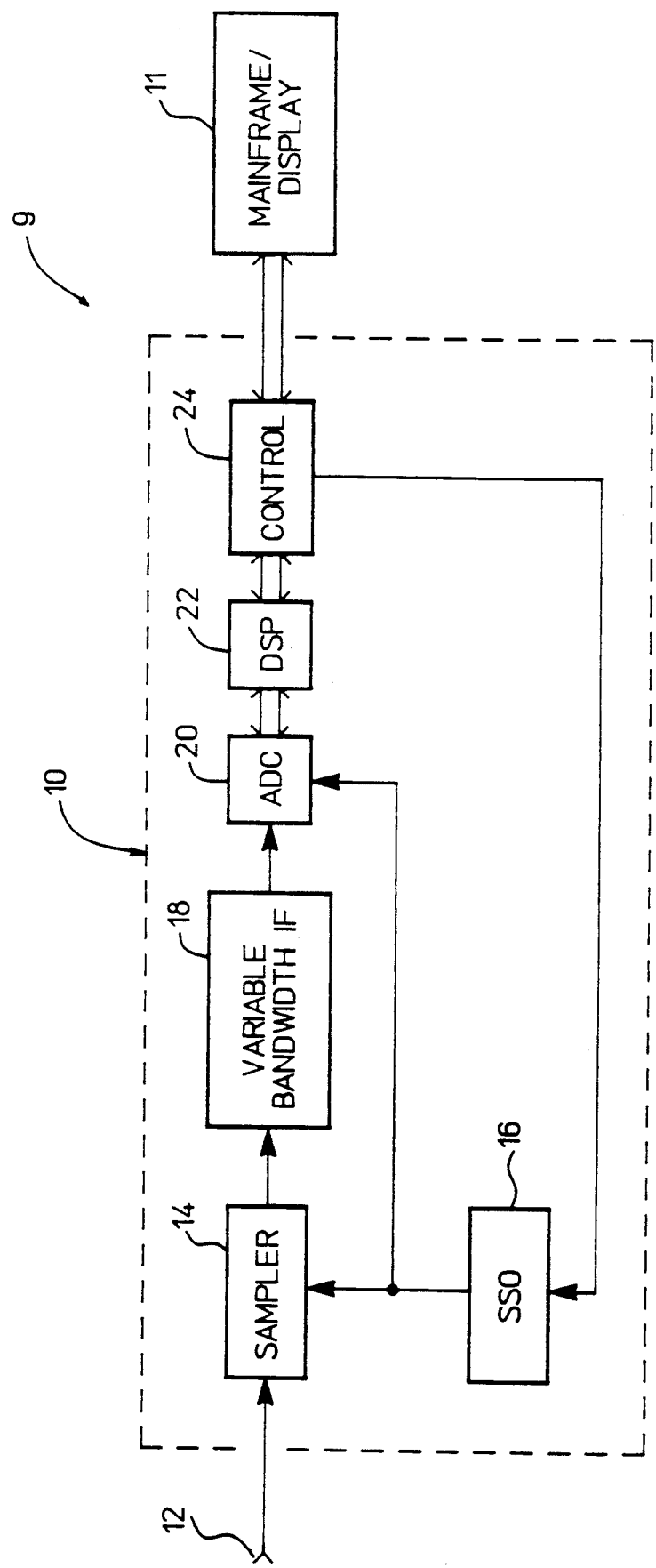
FIG. 4 is a block diagram of a microwave transition analyzer system which incorporates one embodiment of the sampling signal analyzer in accordance with the invention.

A block diagram of a microwave transition analyzer system incorporating a sampling signal analyzer in accordance with one embodiment of the invention, generally indicated by the numeral 9, is shown in FIG. 4. The microwave transition analyzer system 9 comprises a sampling signal analyzer provided in accordance with the invention, generally indicated by the numeral 10, and a mainframe/display circuit 11.

As shown in FIG. 4, the sampling signal analyzer 10 is connected to an input port 12 and comprises a sampler 14, a variable frequency sampling signal oscillator (SSO) 16 preferably in the form of a fractional-N synthesized source having a narrowband phase lock loop for driving the sampler, a variable bandwidth (typically lowpass) IF scaling and filtering circuit 18 responsive to the IF signal produced by the sampler, an analog-to-digital converter (ADC) 20 for digitizing the IF signal in synchronization with the signal produced by the SSO, a digital signal processing (DSP) circuit 22 responsive to the digitized IF signal, and a control circuit 24. An input signal is received at the input port 12 by the sampler 14 being driven by the SSO 16, then through the IF scaling and filtering circuit 18 to the ADC 20. Preferably, the digitized signal is fed from the DSP circuit 22 by the control circuit 24 to the mainframe/display circuit 11 and thereafter to a display screen so that a replica of the input signal wave form is displayed.

Figure 5A:
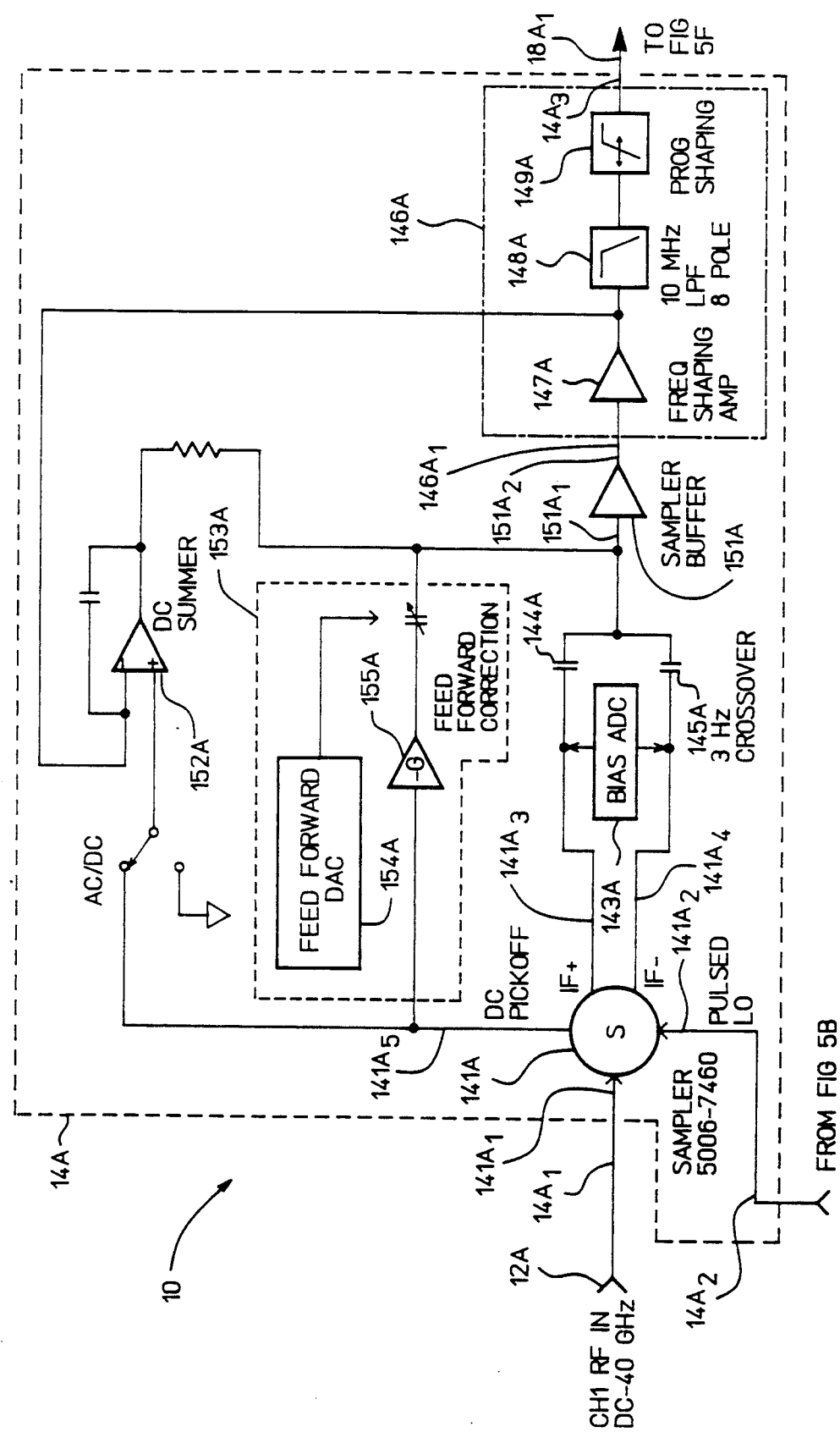

As shown in FIGS. 5A and 5B, the sampling signal analyzer 10 can have at least one channel and preferably has a plurality of channels, for example, channel 1 (CH1) and channel 2 (CH2). Since each channel preferably comprises identical elements and can operate identically, only one channel, i.e., channel 1, will be described in detail. Corresponding elements in channel 1 are provided with an "A" suffix and in channel 2 are provided with a "B" suffix.

With regard to FIG. 5A, an input signal to be measured is fed to the input port 12A of the sampling signal analyzer 10. For example, the input signal to be measured can have an unknown or a known fundamental frequency and harmonics of that frequency in a range from DC to 40 GHz. The input signal can be, for example, an unknown propagating electrical signal or a signal produced by a device under test (DUT) in response to an applied electrical stimulus whose frequency is known.

The input port 12A is connected to a first input $14A_1$ of the sampler 14A. The sampler 14A also comprises a second input $14A_2$ connected to an output $16A_1$ of the sampling signal oscillator (SSO) 16 (FIG. 5E) which produces a sampling signal that is not only fed to the sampler 14A for channel 1, but also is preferably fed to the sampler 14B for channel 2, as shown in FIG. 5B.

The sampler 14A is a continuously running analog circuit for sampling the input signal appearing at the input port 12A. Sampling is synchronized to the operation of a reference oscillator associated with the SSO 16, as will be described in more detail below. The sampler 14A produces analog samples of the input signal appearing at the input port 12A at the frequency of the signal generated by the SSO 16, and these samples constitute an intermediate frequency (IF) signal. This IF signal appears at an output $14A_3$ of the sampler 14A.

The SSO signal is generated by the SSO 16. The SSO 16 drives the sampler 14A. Phase noise affects determination of an unknown input signal frequency. Therefore, the SSO 16 preferably comprises a narrowband fractional-N phase lock loop having low phase noise, which is used to drive the sampler 14A, as will be described in more detail below.

The SSO 16 is configured to generate a variable frequency signal which is routed to the sampler 14A to set a selected frequency for sampling the input signal appearing at the input port 12A. For example, the selected SSO signal frequency can be varied from 10 MHz to 20 MHz. That is, the SSO signal frequency is variable over a one octave range, so that any arbitrary input signal frequency can be converted by the sampling process to an IF signal susceptible to measurement, as will be described later. The SSO signal is also routed to the analog-to-digital converter (ADC) 20A (FIG. 5G) to assure that analog-to-digital conversion is synchronized with sampling of the input signal appearing at the input port 12A.

Figure 5C:
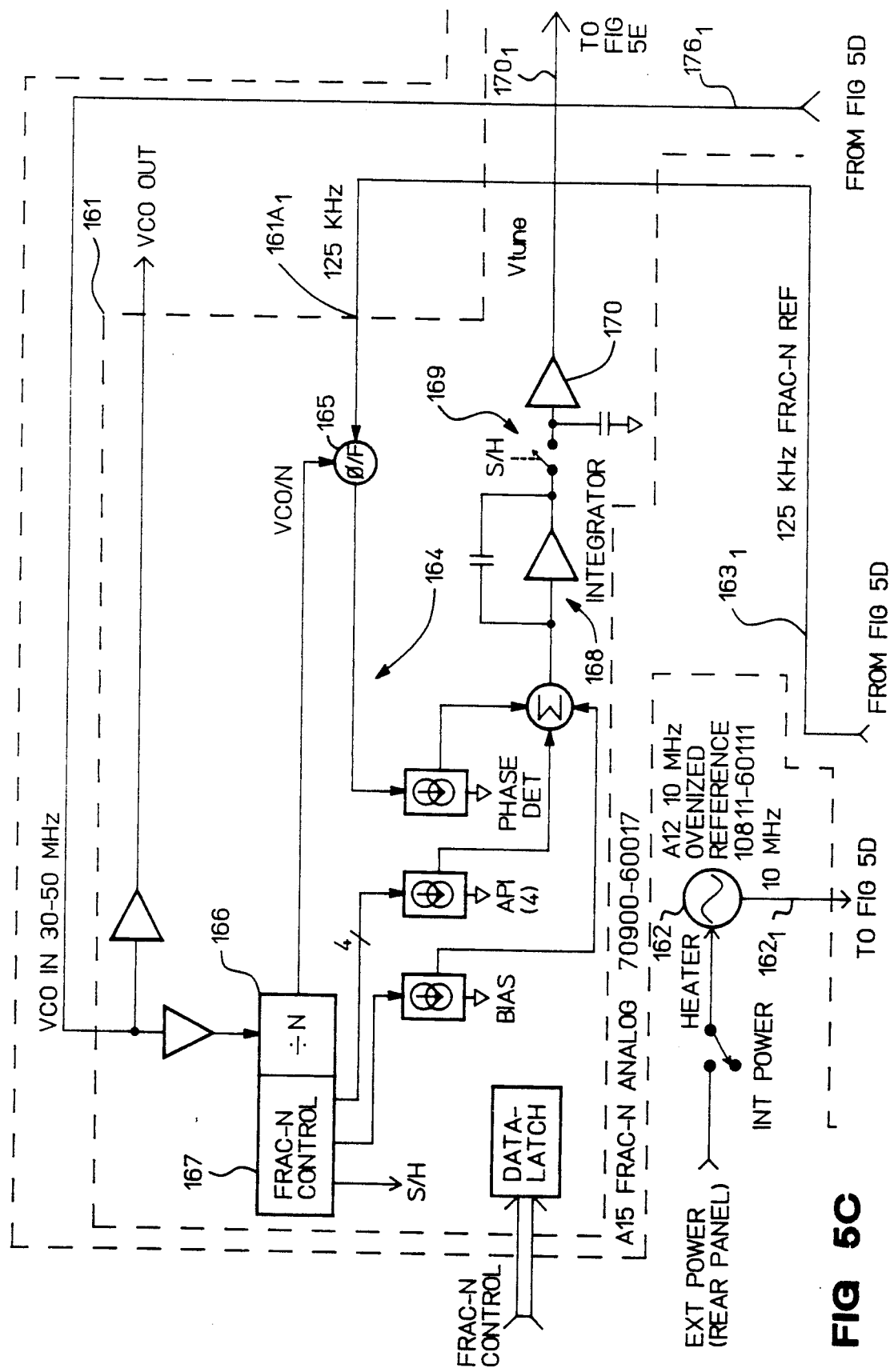
Figure 5D:
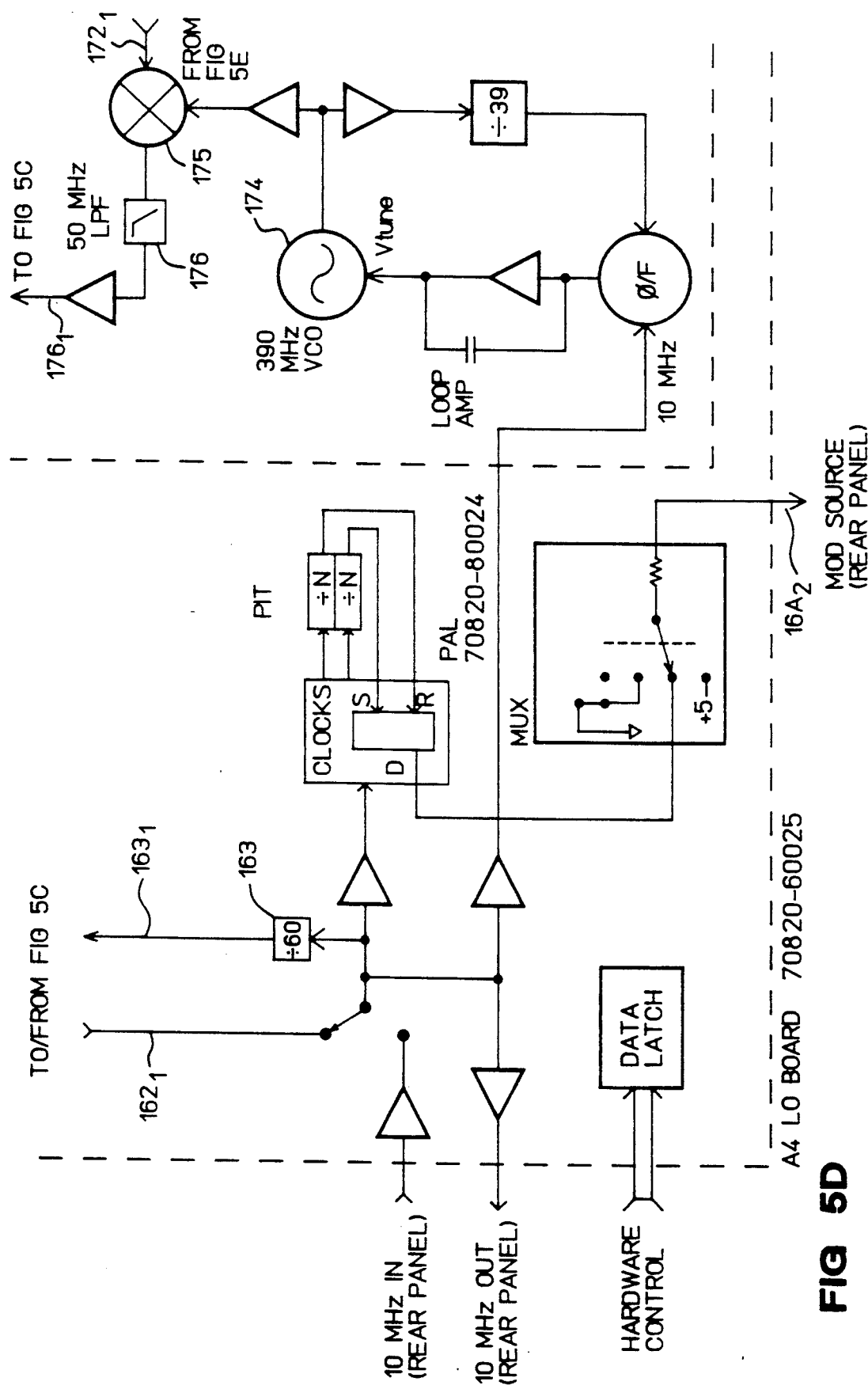

As shown in FIG. 5D, the SSO 16 preferably has an auxiliary output $16A_2$ which provides a synchronized modulation source for directly driving a pulse modulator (not shown) for stimulating a DUT whose output is connected to the input port 12A in a stimulus/response setup, or for serving as a trigger signal for a pulse generator (not shown) used to stimulate a DUT. The pulse modulator or generator can provide the stimulus in connection with the pulse profiling method which will be described later.

The output $14A_3$ of the sampler 14A is preferably connected to an input $18A_1$ of the intermediate frequency (IF) scaling and filtering circuit 18A (FIG. 5F). The IF scaling and filtering circuit 18A amplifies and filters the IF signal comprised of the analog samples produced by the sampler 14A sampling the input signal appearing at the input port 12A. The IF scaling and filtering circuit 18A provides a desired signal level for analog-to-digital conversion and limits spurious frequency components (aliasing) in the IF signal produced by the sampler 14A. The scaled and filtered IF signal comprised of the analog samples is fed to an output $18A_2$ of the IF filtering and scaling circuit 18A.

The output $18A_2$ of the IF scaling and filtering circuit 18A is connected to an input $20A_1$ of the ADC 20A (FIG. 5G). The IF signal comprised of the analog samples produced by the sampling circuit 14A is appropriately scaled by the IF scaling and filtering circuit 18A for analog-to-digital conversion by the ADC 20A.

The ADC 20A converts the IF signal to a digital signal. As indicated above, the SSO signal is routed to the ADC 20A to assure that analog-to-digital conversion is synchronized with sampling the input signal appearing at the input port 12A. Analog-to-digital conversion is synchronized to the operation of the reference oscillator associated with the SSO 16, as will be described in more detail below. The ADC 20A is a continuously running analog-to-digital conversion circuit for digitizing the IF signal comprised of the analog samples of the input signal appearing at the input port 12A. The ADC 20A produces digital samples of the input signal appearing at the input port 12A at a rate of conversion corresponding to the frequency of the SSO signal. These digitized values are accessible at an output $20A_2$ of the ADC 20A.

As shown in FIG. 5G, the output $20A_2$ of the ADC 20A is connected to an input $22A_1$ of the digital signal processing (DSP) circuit 22A. The DSP circuit 22A processes the digitized IF signal to determine the amplitude, phase, and/or frequency characteristics of the input signal appearing at the input port 12A. The DSP circuit 22A can also further process and perform trace math on the digitized IF signal and can transmit the resulting measurement data to the control circuit 24 (FIG. 5H).

As shown in FIGS. 5G and 5H, the DSP circuit 22A is connected by a bus to the control circuit 24 which is also connected to front panel operator controls for the sampling signal analyzer 10. This enables operation of the microwave transition analyzer system 9 to be initiated and for measurement data to be output to external peripheral devices and/or transmitted to the mainframe/display circuit 11 for display under operator control.

Considered in more detail, as shown in FIG. 5A, the sampler 14A preferably comprises a sampling circuit 141A, such as a modified version of the sampler incorporated into the HP 8510 vector network analyzer system manufactured by the Network Measurements Division, Hewlett-Packard Company, Santa Rosa, CA, as described, for example, in U.S. Pat. No. 4,636,717, the disclosure of which is hereby incorporated by reference herein. The HP 8510 vector network analyzer sampler IF is a bandpass structure. For the sampling signal analyzer 10 shown in FIG. 5, this sampler IF is instead a lowpass configuration with an upper bandwidth set by the IF scaling and filtering circuit 18A (FIG. 5F). Any reduced IF bandwidth can be compensated by either frequency domain corrections or digital signal processing of acquired time domain data by the DSP circuit 22A (FIG. 5G) in addition to, or in lieu of, using the IF scaling and filtering circuit 18A.

The input signal to be measured, appearing at the input port 12A, is fed to one input $141A_1$ of the sampling circuit 141A, while the SSO signal generated by the SSO 16 is fed to another input $141A_2$ of the sampling circuit. The sampler 14A preferably comprises a microwave sampler driver 142 connected between the input $141A_2$ of the sampling circuit 141A and the SSO 16 (FIG. 5E), as well as additional pulse sharpening circuitry shown in FIG. 5B, which are responsive to the SSO signal for driving the sampling circuit.

The sampler drive frequency, $f_s$, is varied, for example, between 10 MHz and 20 MHz. The sampler bias voltages (symmetrical plus and minus) are adjusted depending upon $f_s$. As shown in FIG. 5A, this output drives a buffer amplifier stage. DC to approximately 3 Hz information is detected at a third sampler output and summed back into the response before the IF filters.

More particularly, the sampling circuit 141A produces a differential signal at outputs $141A_3$ and $141A_4$. The differential output signal preferably can be selectively biased by signals produced by a digital-to-analog converter (DAC) 143A. The differential output signal is then routed through coupling capacitors 144A and 145A which eliminate DC components in the differential output signal produced by the sampling circuit 141A.

By way of further explanation, the sampling circuit capacitor cannot fully charge or discharge with each individual sampler drive pulse. It has a small charging efficiency. This evidences itself as a pole in the sampler IF frequency response, and the sampling circuit's output voltage rolls off at $-6$ dB/octave at IF frequencies above this pole. This pole's location decreases as the sampling rate decreases. Preferably, a programmable zero cancels this effect. Due to the large amount of gain bandwidth needed, this is preferably compensated in two stages, the first stage being a programmable zero rolled off at 1 MHz and the second stage being a fixed zero from 1 MHz to 10 MHz.

More particularly, the coupling capacitors 144A and 145A are coupled to an input $146A_1$ of a frequency response shaping amplifier 146A configured to flatten the sampler signal. That is, the shaping amplifier 146A has a zero at the pole of the sampler IF frequency response. The shaping amplifier 146A comprises a series-connected fixed frequency shaping amplifier 147A, a lowpass filter 148A, and a programmable frequency shaping amplifier 149A. Preferably, the zero to cancel the pole in the IF frequency response of the sampling circuit 141A can be adjusted as the pole of the sampling circuit shifts.

Preferably, as shown in FIG. 5A, a high-impedance summing amplifier 151A is interposed between the coupling capacitors 144A and 145A and the shaping amplifier 146A. More particularly, the coupling capacitors 144A and 145A are connected to an input $151A_1$ of the summing amplifier 151A. An output $151A_2$ of the summing amplifier 151A is in turn connected to the input $146A_1$ of the shaping amplifier 146A.

A DC level of the input signal to be measured, appearing at the input port 12A, is fed from an additional output $141A_5$ of the sampling circuit 141A though a negative feedback DC summing amplifier 152A to the input $151A_1$ of the summing amplifier 151A to re-inject any DC component of the input signal to be measured into the IF signal produced by the sampling circuit 141A.

A signal correction circuit 153A, comprising a feed forward DAC 154A and an inverting amplifier 155A, is also connected between the additional output $141A_5$ of the sampling circuit 141A and the input $151A_1$ of the summing amplifier 151A. The feed forward DAC 154A provides programmable gain. The correction circuit 153A functions to cancel any frequency component(s) of the input signal to be measured which correspond(s) to a signal(s) appearing at the outputs $141A_3$ and $141A_4$ of the sampling circuit 141A occurring between sampling times due to leakage through the sampling circuit.

More particularly, the entire input signal should pass through the sampling process. However, a small parasitic capacitance across the sampling circuit diodes forms a capacitive divider which allows a portion of the input signal to pass directly into the IF. For frequencies above the IF filter cutoff, the leakage signal is filtered out. But for frequencies within the IF bandwidth, the leakage signal is an unwanted response. To remove this unwanted signal, a similar signal is extracted from the additional output $141A_5$ of the sampling circuit 141A, inverted to be 180 degrees out of phase by the correction circuit 153A, and then summed back in to cancel the unwanted response.

As shown in FIGS. 5C, 5D, and 5E, the sampling signal oscillator (SSO) 16 produces a sampling signal for both channel 1 and channel 2. The SSO 16 comprises a modified narrowband fractional-N synthesized source 161 (FIG. 5C). The fractional-N synthesized source 161 comprises an input $161A_1$ connected to a reference oscillator 162. For example, the reference oscillator 162 can be a 10 MHz reference oscillator. The reference oscillator 162 can be a reference oscillator internal to the sampling signal analyzer 10 or can alternatively be an external reference oscillator.

In the circuit implementation shown in FIG. 5, the signal generated by the reference oscillator 162 is fed to a divide-by-80 counter circuit 163 (FIG. 5D) which produces a 125 kHz fractional-N reference frequency signal. The fractional-N reference frequency signal is routed to a first phase lock loop 164 which phase-locks the fractional-N synthesized source 161 to the reference oscillator 162. More particularly, the fractional-N reference signal is fed to one input of a phase/frequency detector 165 whose other input is connected to a divide-by-N counter circuit 166. The divide-by-N counter circuit 166 is controlled by a fractional-N control circuit 167 for setting the value N.

In response to the signal generated by the fractional-N synthesized source 161, the fractional-N control circuit 167 produces a bias current and an accumulated phase current (API) which are combined with a phase/frequency detector signal at a summing input of an integrator circuit 168, and the voltage produced by the integrator circuit is sampled and held by a sample/hold circuit 169 to remove spurs in the output of the fractional-N synthesized source.

The signal produced by the integrator circuit 169 drives a tune voltage amplifier 170 which is connected through a filter circuit 171 (FIG. 5E) to a tune voltage input of a high-frequency voltage controlled oscillator (VCO) 172. For example, the VCO 172 can operate over a frequency range of 420 MHz to 440 MHz. An output of the VCO 172 is in turn connected to a divide-by-N counter circuit 173 to provide the SSO signal. For example, N can be set from 22 to 42 so that the frequency of the SSO 16 is in a range of 10 MHz to 20 MHz.

The fractional-N synthesized source 161 also preferably comprises a 390 MHz oscillator 174 (FIG. 5D) connected in a conventional phase lock loop to lock the 390 MHz oscillator to the reference oscillator 162. The output of the VCO 172 (FIG. 5E) is connected to one input of a mixer 175 (FIG. 5D) whose other input is connected to the output of the 390 MHz oscillator 174. The output of the mixer 175 is in turn connected through a low pass filter 176, which removes the mixing image, to the fractional-N synthesized source 161 (FIG. 5C). This enables the SSO 16 to have precise frequency resolution and, by using a high-frequency oscillator, such as the VCO 172, and dividing the frequency down to a lower frequency, for example, by means of the divide-by-N counter circuit 173, the SSO 16 has low phase noise. Selectable filters 177 (FIG. 5E) are also preferably incorporated into the SSO 16 between the divide-by-N counter circuit 173 and the output $16A_1$ of the SSO to provide a 50% duty cycle and to reduce divider phase noise.

The fractional-N synthesized source printed circuit board is preferably similar to the HP 70900 local oscillator printed circuit board (70900-60017) available from the Signal Analysis Division of Hewlett-Packard Company. It sets the sampler drive rate to millihertz resolution between 10 MHz and 20 MHz. The fractional-N synthesized source 161 is controlled and set by the control circuit 24 (FIG. 5H) on a processor printed circuit board, as will be described in more detail below. The SSO 16 printed circuit board (70820-60025) is used in conjunction with the fractional-N synthesized source board to form the complete phase lock loop circuit which generates the correct sampler drive frequency with the appropriate resolution.

As shown in FIG. 5F, the IF scaling and filtering circuit 18A comprises a DC offset DAC 180A, an attenuator 181A, and a variable step gain amplifier 182A. Additionally, the IF scaling and filtering circuit 18A comprises lowpass filters 183A and 184A to limit aliasing and remove feedthrough of the sampler 14A. The IF scaling and filtering circuit 18A comprises an additional IF lowpass filter 185A and additional step gain amplifiers. Also, the IF scaling and filtering circuit 18A can comprise an additional lowpass filter 186A preferably combined with a step gain amplifier, which can be selectively switched into the IF scaling and filtering circuit to reduce noise in various measurement applications, such as oscilloscope-type measurements.

More particularly, filter designs are fixed at $f_s/2$ and have sufficient rolloff to completely eliminate responses from the next comb tooth ($f_s$ away). The IF scaling and filtering circuit 18A has 16 MHz, 10 MHz, 7 MHz, and 100 kHz lowpass filters. The 100 kHz lowpass filter 186A is used for noise reduction in certain measurements. Using a 100 kHz IF bandwidth with a 20 MHz sampler drive produces a signal to noise improvement of approximately 29 dB. To accommodate this sensitivity, 24 dB of additional programmable step gain is incorporated into the IF.

The dynamic range of the sampling signal analyzer 10 is limited by the 10-bit ADC 20A that follows the IF scaling and filtering circuit 18A. By providing variable step gains, a wider amplitude range of input signals can be measured. The 10 MHz path has one 0 to 6 dB attenuator and three 0 to 12 dB gain stages. The 100 kHz path has 0 to 24 dB of additional gain available.

As shown in FIG. 5G, the ADC 20A comprises a conventional sample/hold circuit 201A. An input $20A_3$ of the ADC 20A is connected to the output $16A_1$ of the SSO 16 (FIG. 5E) so that the SSO signal is fed to the sample/hold circuit 201A which responds to the SSO signal to sample at the frequency of the SSO signal and in synchronization with the sampling performed by the sampler 14A. The analog signal stored on a capacitor included in the sample/hold circuit 201A is converted by a conventional analog-to-digital conversion (ADC) circuit 202A to a 10-bit digital value which is written through a serial/parallel interface 203A to a measurement data random access memory (RAM) 204A.

The ADC 20A printed circuit board (70820-60039) and the ADC 20B printed circuit board (70820-60040) are similar to the analog-to-digital converter printed circuit board (70700-60003) incorporated into the HP 70700 digitizer available from the Signal Analysis Division of Hewlett-Packard Company. The main difference between the converter board in the HP 70700 digitizer and the boards for the ADCs 20A and 20B in the sampling signal analyzer 10 is the addition of a Motorola DSP 56001 digital signal processing chip and DSP RAM (32k×24) on each converter board.

The sampling rate of the ADC circuit 201A is controlled by the ADC clock which is generated by the SSO 16 printed circuit board (70820-60025). The clock rate of the ADC 20A is equal to the sampler drive rate. Importantly, the sampler 14A and the ADC 20A are clocked at the same frequency, so that the phase of the sampled input signal appearing at the input port 12A can be extracted through calibration and digital signal processing which compensate for circuit time delays and other circuit limitations.

Addressing and read/write control for the measurement data RAM 204A are provided by a read/write address control circuit 205 (FIG. 5H) whose rate of memory access can be controlled by a divide-by-N counter circuit 206. This enables the digitized samples to be parsed, so that digital values are stored in the measurement data RAM 204A at periodic intervals equal to or longer than the period of the SSO signal. The address printed circuit board (70700-60037) is used to control the collection of digital data from the ADC circuit 202A.

Since the sampling signal analyzer 10 can be used to replicate a wave form as a voltage versus time trace, triggering is an important consideration. However, the sampling signal analyzer 10 measures the input signal appearing at the input port 12A without the aid of a traditional trigger circuit that responds directly to the level of the input signal.

Instead, the ADC 20A can comprise a trigger circuit 207A responsive to the level of the IF signal to initiate storage of measurement data in the RAM 204A so that measurement data is properly aligned from sweep to sweep. Accordingly, the trigger does not control the sampling of the input signal appearing at the input port 12A, since this process is continuously running so that the input signal is continuously sampled. What is triggered are the sequential times at which sampled data is stored in the measurement data RAM 204A, which can be the same or a time longer than the period of the SSO signal. The trigger level is preferably adjustable. In the embodiment shown in FIG. 5, the trigger circuit 207A detects an IF signal level at or above the trigger level. Significantly, the operation of the trigger circuit 207A is more frequency and amplitude independent than known directly triggered data sampling signal measurement instruments, since the trigger circuit only needs to operate at the SSO signal frequency or lower, rather than at the fundamental frequency or harmonics of the input signal to be measured, which can be much higher, for example, three orders of magnitude (4,000 times) higher in the exemplary case. Also, an input signal level as low as −60 dBm can be acquired, but the trigger circuit 207A only needs to operate down to −20 dBm, which is two orders of magnitude higher and a significant improvement over the capability of known directly triggered data sampling signal measurement instruments.

As shown in FIG. 5G, the DSP 22A comprises a DSP microprocessor 221A connected by a bus to the measurement data RAM 204A. The DSP microprocessor 221A is connected by another bus to a DSP RAM 222A which is used for local data storage. Instructions are downloaded from the control circuit 24 (FIG. 5H) into program RAM internal to the DSP microprocessor 221A. Firmware routines are executed by the DSP microprocessor 221A to manipulate the measurement data stored in the RAM 204A and DSP RAM 222A.

As shown in FIG. 5H, the control circuit 24 comprises a main microprocessor 241 connected by a bus to the DSP microprocessor 221A (FIG. 5G). The main microprocessor 241 interfaces with the DSP microprocessor 221A so that measurement data can be transmitted to the mainframe/display circuit 11 and routed to a CRT display screen 26 or off-loaded to any of an array of available peripheral devices via an HP-IB connection (Hewlett-Packard Company's implementation of the IEEE-488 interface).

The processor printed circuit board (70820-60026) is also the main system controller. It contains a Motorola 68000 central processing unit (CPU) with 512k×16 of ROM and 256k×16 of static RAM. The processor board controls HP-IB communication between the sampling signal analyzer 10 and the mainframe/display circuit 11. Also, the processor board controls HP-MSIB communication (see U.S. Pat. No. 4,768,145) between the sampling signal analyzer 10 and the mainframe/display circuit 11 on a HP-MSIB bus used for initiation of measurements and downloading of control information entered by the operator using a control panel 28.

The processor board contains 32K×16 battery backed-up RAM, as well as 16k×8 EEROM. The processor board also controls a real-time clock chip which provides the time of day.

The processor board communicates with the other printed circuit boards over a three-wire serial interface bus which is controlled by the processor board. A versatile interface adapter (VIA) is used for communication between the fractional-N synthesized source 161 (FIG. 5C) and the processor board.

The mainframe/display circuit 11 interfaces with control panel 28 which comprises front panel operator controls for selecting various measurements on the input signal appearing at the input port 12A and for specifying various control information for operation of the sampling signal analyzer 10. The mainframe/display circuit 11 interfaces with the control circuit 24 to transmit the control information to the sampling signal analyzer 10. The control information is routed to the main microprocessor 241 for control of the sampling signal analyzer 10. The mainframe/display circuit 11 is preferably an HP 70004A mainframe/display available from the Signal Analysis Division of Hewlett-Packard Company.

In operation, the sampling signal analyzer 10 can be commanded by the operator using the control panel 28 to identify an unknown input signal appearing at the input port 12A. For example, the sampling signal analyzer 10 can receive a random frequency input signal in the range of DC to 40 GHz at the input port 12A. The sampling signal analyzer 10 then identifies the fundamental frequency of the unknown input signal appearing at the input port 12A. Determining the exact fundamental frequency of an unknown input signal is an important aspect of the operational capability of the sampling signal analyzer 10 and will be described in more detail below.

Alternatively, the operator can enter a frequency using numeric keys of a keyboard on the control panel 28, which the sampling signal analyzer 10 will consider to be the fundamental frequency of the input signal appearing at the input port 12A. For example, the operator can enter the fundamental frequency of a known input signal applied to the input of a DUT whose output is connected to the input port 12A in a stimulus/response setup.

If the sampling signal analyzer 10 is requested to identify an unknown input signal appearing at the input port 12A, it acquires several time records at different sampling frequencies, processes the time data, and determines the fundamental frequency. At this juncture, or if the fundamental frequency of the input signal has alternatively been entered by the operator, the sampling signal analyzer 10 selects a sampling frequency which will frequency-translate the input signal to be measured in a manner that enables reconstruction of the input signal wave form with respect to a calibrated time axis.

Specifically, the main microprocessor 241 selects a sampling frequency in the 10 MHz to 20 MHz range by presetting the divide-by-N counter 173 of the SSO 16. The sampling circuit 141A then samples the input signal appearing at the input port 12A to frequency-translate the input signal to an IF signal. The fundamental and harmonic frequency components of the input signal are frequency-compressed into the IF signal spectrum which has a DC to 10 MHz IF bandwidth. When the input signal is compressed into this bandwidth, the frequency components are ordered in proper spectral sequence so that the wave form of the input signal is completely replicated, thereby allowing direct measurement of the signal.

The bandwidth-limited IF signal is amplified with sufficient step gain to provide an appropriate IF signal level to the ADC 20A. In one embodiment, the sampling signal analyzer 10 triggering is based on this IF signal and used for storing measurement data in the RAM 204A so that this measurement data is aligned with respect to a calibrated time axis from one sweep to the next. Alternatively, triggering can be referenced to a desired phase of the fundamental frequency of the input signal. The operator can adjust the delay between triggering and measurement data storage and thereby select variable amounts of negative time.

Digital signal processing employing firmware resident in the DSP microprocessor 221A can further compensate for circuit limitations, such as sampler rolloff and IF amplitude and phase variations as a function of frequency, as well as aliasing that occurs due to the sampling performed by the sample/hold circuit 201A. That is, the IF path is preferably further corrected with firmware to provide a flat signal response (DC to 10 MHz). Better selectivity can be achieved by narrowing the IF bandwidth. This can be accomplished by additional analog filtering or by employing digital filtering of the measurement data produced by the ADC 20A. These are equivalent, although some analog filtering may be needed to prevent the ADC 20A from limiting.

Digital filtering, averaging, demodulation, and/or smoothing can be applied to the measurement data by the DSP circuit 22A before formatting the data for display. Finally, the DSP circuit 22A and control circuit 24 cause the wave form of the input signal to be displayed across the time range previously entered by the operator using the numeric keys on the control panel 28.

In the case of a somewhat unstable input signal, the sampling signal analyzer 10 will magnify that instability on the CRT display screen 26. For example, suppose that 1 MHz is the IF frequency and that the input signal appearing at the input port 12A is a 20 GHz signal that drifts 100 kHz. The actual input signal has drifted 100 kHz divided by 20 GHz, or 1 in 200,000. For the sampling signal analyzer 10, if the input signal moves 100 kHz, the input signal moves 100 kHz closer to a synthesized harmonic, and the IF frequency moves 100 kHz divided by 1 MHz, or 1 in 10. Consequently, the time per division error of the wave form displayed would be 10%, versus the actual drift of 0.0005%. However, the frequency drift can be tracked and at least partially compensated by digital signal processing.

The operation of the sampling signal analyzer 10 used to acquire measurement data for an input signal will now be described in detail. The sampling signal analyzer 10 provides various modes of operation. These modes of operation include "time sweep mode," "frequency sweep mode," and "power sweep mode."

The operator can invoke the time sweep mode by a series of keystrokes preferably provided by soft keys on the control panel 28 of the mainframe/display circuit 11. For example, the operator can invoke the time sweep mode by sequentially depressing displayed soft keys labeled "SWEEP" and "TIME."

In the time sweep mode, there are two alternative procedures which can be performed by the sampling signal analyzer 10. These procedures depend upon whether or not the input signal fundamental frequency is known.

On the one hand, if the fundamental frequency of the input signal appearing at the input port 12A is known, for example, the input signal is applied to the input of a DUT whose output is connected to the input port 12A, the operator depresses a soft key displayed on the control panel 28 labeled "SIGNAL FREQUENCY" and subsequently enters the value of the fundamental frequency using the numeric keys on the control panel and also enters the time range for display of the wave form of the input signal. The sampling signal analyzer 10 then executes a procedure to cause the wave form of the input signal to be displayed across the time range entered by the operator.

On the other hand, if the fundamental frequency of the input signal is not known, the sampling signal analyzer 10 needs to identify the fundamental frequency of the input signal. This identification procedure is initiated by the operator depressing a "FIND SIGNAL" soft key displayed on the control panel 28 and entering the time range for display of the wave form of the input signal using the numeric keys on the control panel.

In response to depression of the "FIND SIGNAL" soft key, the sampling signal analyzer 10 determines the frequency components of the input signal appearing at the input port 12A. This is accomplished by setting the IF bandwidth as wide as it can be set, then setting the frequency of the SSO 16 to a frequency less than twice the bandwidth. This will assure that for any input signal frequency, it will be within plus or minus an IF bandwidth away from a comb tooth of the SSO 16 signal and will mix into the IF.

Next, the sampling signal analyzer 10 acquires a first time record with the ADC 20A. The first time record is processed by a fast Fourier transform (FFT), and the positions and amplitudes of the signal responses are stored.

Advantageously, the processing gain of the FFT will spread the 40 GHz of noise uniformly over the number of FFT outputs, while the signal amplitude remains constant. This yields improved signal to noise (sensitivity).

Then, the SSO 16 is set to another frequency (still less than twice the IF bandwidth), and a second time record is acquired. The second time record is also processed by the FFT, and the signal responses are stored.

For example, if the synthesized frequency is moved 1 kHz and an IF response moves 300 kHz, then the response is mixing off the 300th harmonic of the frequency of the SSO 16. By the direction the IF response moves, it can be determined on which side of the 300th comb tooth that the input signal frequency is located.

The frequency (harmonic number times synthesized frequency plus or minus IF frequency) of the input signal is now conclusively determined. If there are multiple inputs, or many harmonics, or modulation on the input signal, more time records and FFT processing are needed to determine how all of the signal responses are interrelated. The sampling signal analyzer 10 will then determine the sampling signal frequency to mix with the input signal in the IF based on the fundamental frequency of the input signal and the display time range previously entered by the operator, across which the input signal wave form is to be displayed.

Considered in more detail, the sampling signal analyzer 10 operates as follows to measure a known frequency input signal appearing at the input port 12A. That is, the known input signal frequency is entered by the operator.

Figure 6:
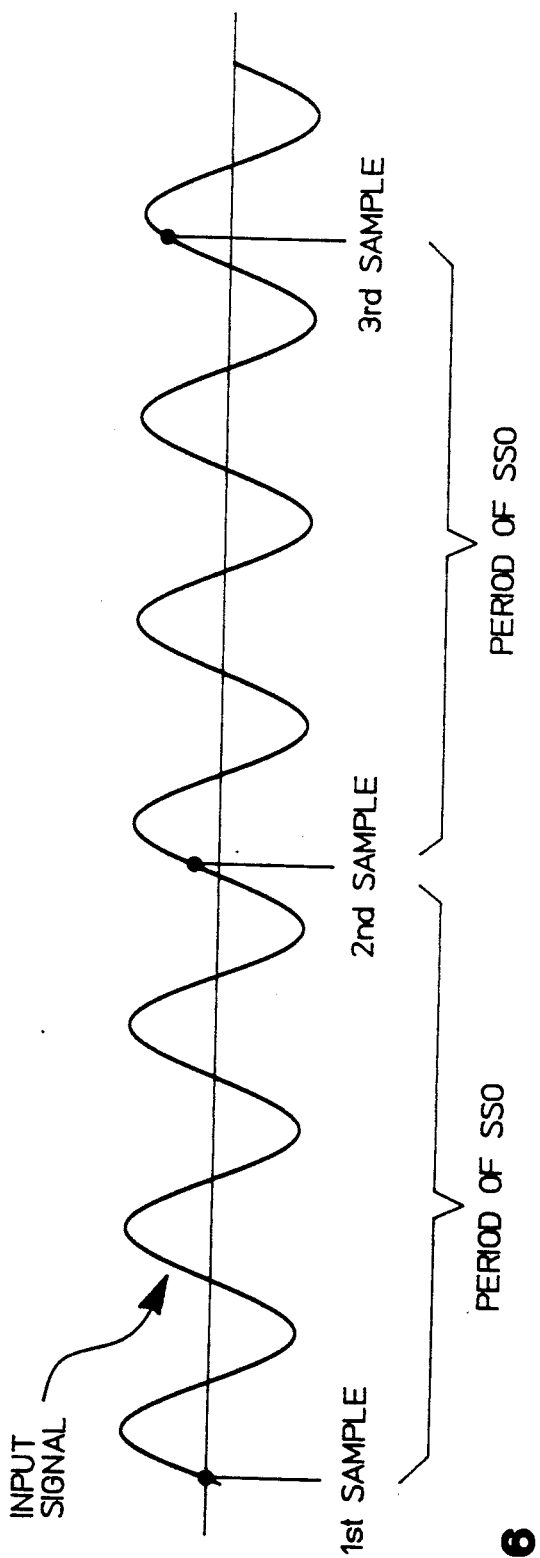
FIG. 6 illustrates a sampling signal oscillator frequency selected so that sampled data points precess through an input signal wave form from cycle to cycle for use in describing the input signal frequency identification method of the invention.

The main microprocessor 241 sets the frequency of the SSO 16 near a sub-harmonic of the input signal frequency. The frequency of the SSO 16 is preferably selected so that the sample points will increment forward through the input signal, as shown in FIG. 6. Each time that the sampling circuit 141A is enabled, a different point on the input signal is sampled.

For example, suppose that the input signal frequency is 100 MHz. If the sampling signal frequency were chosen to be exactly 20 MHz, then the sampling circuit 141A would sample the same point on the input signal wave form each time that the sampling circuit is enabled, and the wave shape of the input signal could not be reconstructed.

Figure 7:
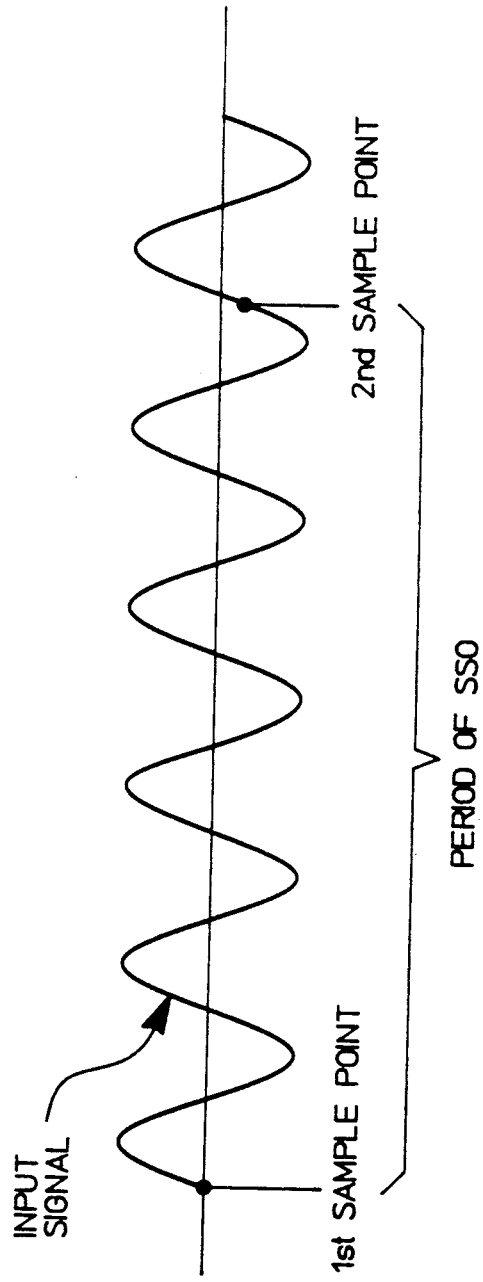
FIG. 7 illustrates the sampling frequency selected so that the sampled data points move backward through the input signal wave form for use in describing the input signal frequency identification method of the invention.

Therefore, the sampling signal frequency is selected to be slightly less than 20 MHz (that is, the period between samples is slightly greater than 50 nanoseconds). Accordingly, each time that the sampling circuit 141A is enabled, a different point on the input signal wave form is sampled, as shown in FIG. 6. As illustrated in FIG. 6, the sample points are slowly moving through the input signal in a forward direction. Alternatively, if the sampling frequency were selected to be slightly greater than 20 MHz, the sample points would move slowly backward through the input signal wave form, as shown in FIG. 7.

Figure 8:
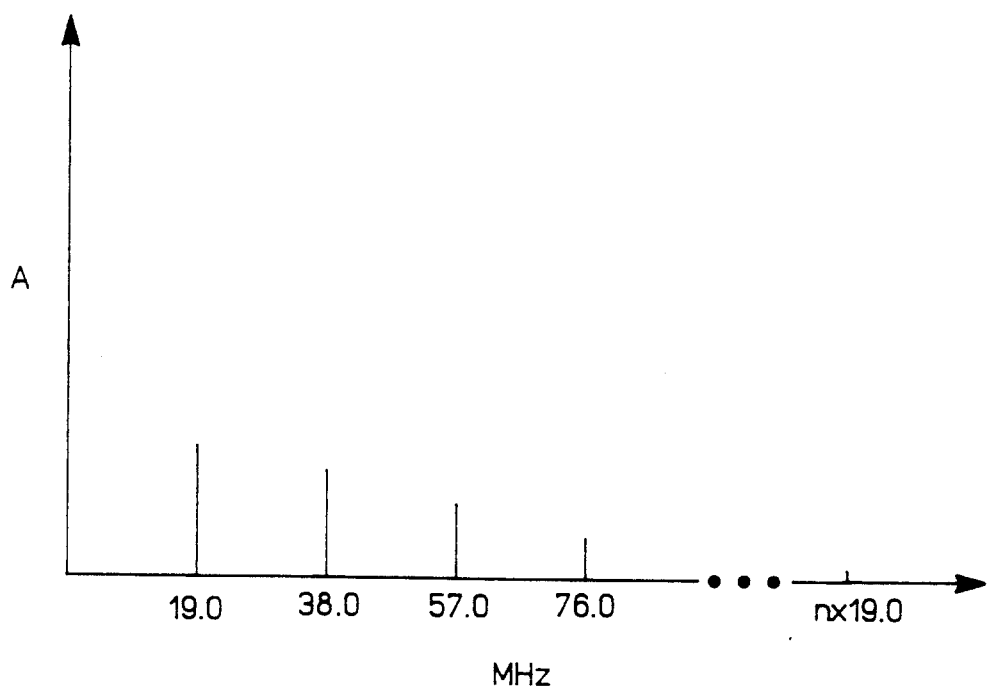
FIG. 8 illustrates a frequency spectrum of a sampling signal.

To better understand how the sampling signal analyzer 10 operates to measure a known input signal, assume that the input signal has only one frequency present, for example, assume that the input signal frequency is 100 MHz. The main microprocessor 241 sets the SSO 16 to a known frequency, such as 19 MHz. A sampling signal at this frequency produces a frequency spectrum of impulses having a spacing as shown in FIG. 8. When the 100 MHz input signal frequency is sampled, the resulting frequencies appear as shown in FIG. 9.

Figure 9:
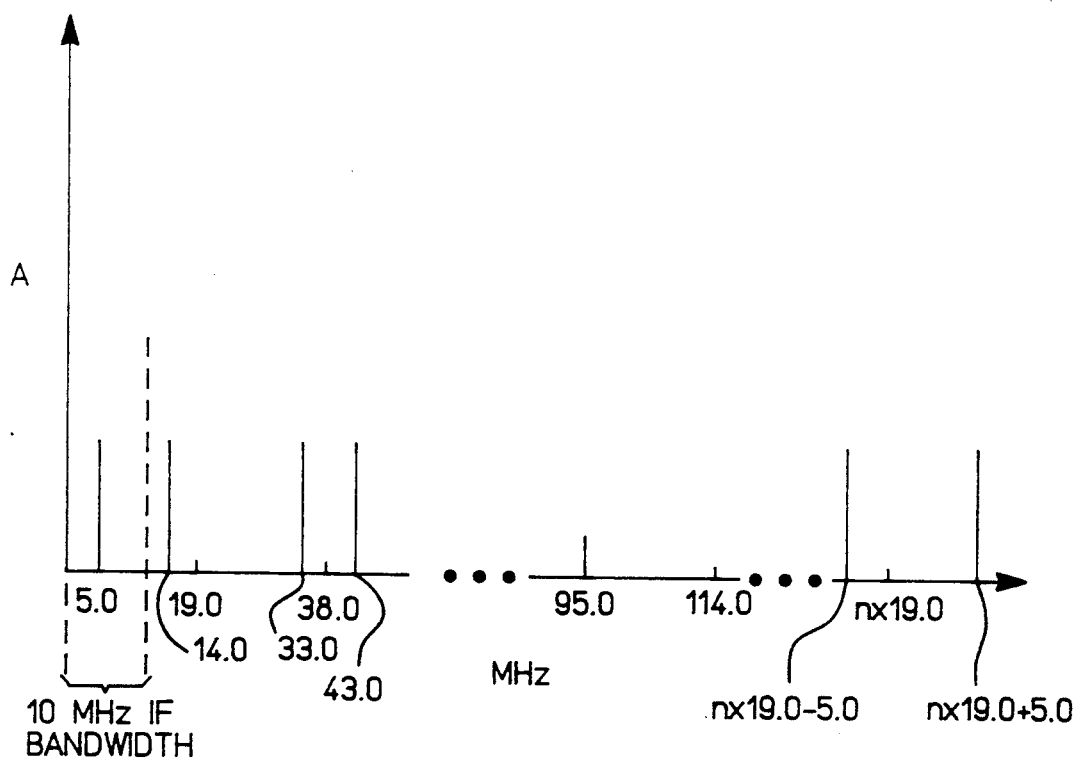
FIG. 9 illustrates a frequency spectrum of an intermediate frequency signal for use in describing frequency translation and frequency compression.

As shown in FIG. 9, the 100 MHz signal appears as a 5 MHz IF signal. The 5 MHz IF signal is the result of the difference between 100 MHz and 95 MHz (fifth harmonic of the frequency of the SSO 16).

It is noted that there are many mixing products present, such as a 14 MHz signal, due to the 100 MHz and 114 MHz mixing. However, because the bandwidth of the sampling signal analyzer 10 IF is limited to a maximum of 10 MHz by the IF lowpass filter 185A, any signal produced which has a frequency greater than 10 MHz is filtered out. Therefore, only the 5 MHz IF signal shown in FIG. 9 is measured in the IF of the sampling signal analyzer 10. In summary, the IF signal is equal to 5 MHz.

In the previous example, the supposition was that the input signal consisted of a pure tone with no harmonics present. Of course, this is seldom the case. The sampling signal analyzer 10 must also be able to measure an unknown input signal appearing at the input port 12A. Moreover, the sampling signal analyzer 10 must not only correctly identify the fundamental frequency of an unknown input signal and its harmonics, but must identify other fundamentals in the input signal and their harmonics as well. This results in the following input signal identification method for an unknown input signal.

The DSP microprocessor 221A executes resident firmware which identifies the frequency components of all input signals appearing at the input port 12A, when the "FIND FREQUENCY" soft key on the control panel 28 is depressed by the operator. Although the input signal identification method to be described is not restricted in the number of frequency components which can be identified, there is a corresponding increase in analysis (processing) time for a firmware routine optimized to find every frequency component. That is, the method can be optimized to enable three or four non-harmonically related signals (fundamentals), each having three or four harmonics, to be identified. Modifications to the input signal identification method will be described where appropriate to indicate the trade-off between exhaustive identification and analysis time.

The input signal identification method can be simplified by dividing the firmware routine into four major subroutines. These subroutines are: 1) generation of possible input signal frequencies; 2) elimination of frequencies; 3) determination of fundamental frequency components; and 4) precision measurement of fundamental frequencies. These subroutines will now be described in connection with the flow chart shown in FIG. 10.

The subroutine for generation of possible input signal frequencies is executed as follows. Two measurements are performed at different sampling signal frequencies, as indicated by the numerals 302 and 304 shown in FIG. 10A, respectively. That is, two sweeps are performed at different sampling frequencies to acquire a time record at each sampling frequency. For example, the first measurement can be performed at a sampling frequency of approximately 20 MHz, as shown by the step 302, and the second measurement can be performed at a sampling frequency which is 10 kHz lower (19.990 MHz), as shown by the step 304. For speed reasons, only a small trace size is preferably acquired, for example, 256 data points, but if a more comprehensive input signal identification is needed, the number of data points can be increased.

The digitized samples comprising the time record from the first measurement are transformed to the frequency domain employing an FFT, and the IF frequencies of all signal peaks are stored in the measurement data memory 204A. The same procedure is performed for the second measurement.

The two frequency lists comprising the results of the FFT transformations are not necessarily sorted in any particular order, but in one preferred implementation they are sorted by amplitude. The amplitude information can typically be ignored after this juncture, unless plural fundamental frequencies in the input signal are identified. The frequency lists from the two measurements are then employed to generate a much larger list of all possible frequencies, including fundamental frequencies, appearing at the input port 12A, which correspond to the IF frequencies of the signal peaks.

Now, let N1 be the number of signal peaks, that is, the number of IF signal frequencies found from the first measurement, and N2 be the number of IF signal frequencies found from the second. In general, the number of possible input signal frequencies generated will be 4×N1×N2. The following describes how they are generated.

Consider the first IF signal frequency from the first measurement, $f_1$. For an IF signal frequency at $f_1$, the input signal frequency must be at $n*f_s + f_1$ or $n*f_s - f_1$, where $f_s$ is the sampling frequency of the first measurement and n is an unknown integer greater than or equal to zero. A convenient way to handle the ambiguity in the sign of $f_1$ (i.e., plus or minus) is to include both $f_1$ and $-f_1$ in the frequency list for the first measurement. In this way, negative IF signal frequencies indicate that the input signal frequency is less than the nearest harmonic of the sampling frequency, and positive IF signal frequencies indicate an input signal frequency greater than the nearest harmonic.

Once the negatives of all the found IF signal frequencies are added to the first and second measurements, as shown by the steps 302 and 304, the number of IF signal frequencies to be considered from the first measurement generally increases to 2×N1, and those from the second measurement to 2×N2. Measured IF signal frequencies of 0 Hz (DC) or the sampling frequency divided by two (the Nyquist frequency) do not need their negatives included.

At this juncture, each input signal frequency can be expressed in the form of one of the equations $n \times f_s + f_i$, where $f_i$ is one of the approximately 2×N1 IF signal frequencies from the first measurement, $f_s$ is the sampling frequency for the first measurement, and n is an unknown integer greater than or equal to zero. The results of the second measurement are employed to generate possible values of n for each IF frequency $f_i$, thereby allowing calculation of a list of all possible input signal frequencies. The following describes how this is performed.

Figure 10A:
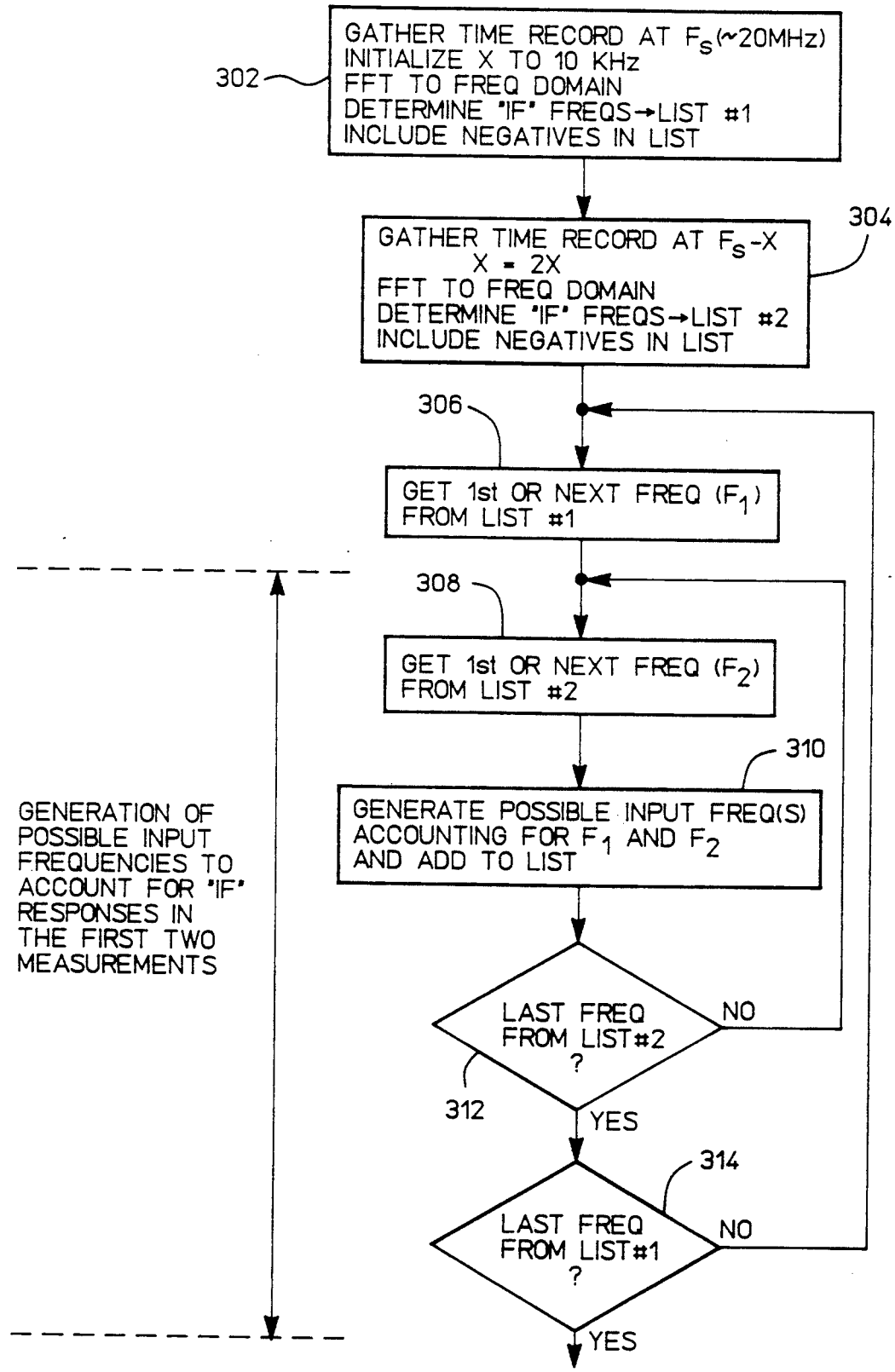
FIGS. 10A and 10B, is a flow chart of one embodiment of the input signal identification method in accordance with the invention.

An IF frequency from the first measurement ($f_i$) is paired with each of the approximately 2×N2 IF signal frequencies from the second measurement, as indicated by the numerals 306, 308, 310, 312, and 314 shown in FIG. 10A. A value of n and, subsequently, a possible input signal frequency, is generated for each of these pairings. This results in the computation of approximately 2×N2 possible input signal frequencies for each of the approximately 2×N1 IF signal frequencies from the first measurement, yielding a total of approximately 4×N1×N2 possible input signal frequencies.

For example, consider a particular IF frequency from each of the two measurements, $F_1$ from the first measurement and $F_2$ from the second measurement. It is assumed that the same input signal frequency accounts for each of these IF responses. Therefore, the input signal frequency can be calculated as $n \times F_s + F_1$, where $F_s$ is the sampling frequency employed for the first measurement and n is calculated as follows in the example where the sampling frequency is decreased by 10 kHz for the second measurement:

if $F_2 \geq F_1$, $n = (F_2 - F_1)/10\ kHz$;

otherwise, $n = (F_2 - F_1 + F_s - 10\ kHz)/10\ kHz.$

Since the sampling frequency was decreased by 10 kHz when the second measurement was performed, the IF signal frequency should increase by n×10 kHz. An apparent decrease in IF signal frequency is the result of the input signal frequency falling closer to the (n+1)th harmonic of $F_s$ minus 10 kHz than to the nth harmonic.

A 10 kHz step of the sampling frequency causes an input signal, if limited in frequency to 40 GHz or less, to produce an IF shift no greater than one sampling frequency harmonic. Therefore, n is uniquely determined by the IF signal frequencies $F_1$ and $F_2$, except for the case when $F_1$ is nearly identical to $F_2$, as explained below. If the input signal frequency range is extended beyond 40 GHz, a smaller initial sampling frequency step is employed, or "n" must be allowed to be multi-valued.

In the event that $F_1$ is nearly identical to $F_2$, both the above formulae for calculation of n are employed, and two possible input signal frequencies are generated. This is because input signal frequencies at the two extremes of the input signal identification range (near DC or 40 GHz) result in almost identical IF frequencies across a 10 kHz step in sampling frequency (if the sampling rate is near 20 MHz). The IF shift for the low frequency is near (or identical to) zero, and the IF shift for the high frequency is near (or identical to) one sampling frequency harmonic.

As an example of the just-described procedure for generating possible input signal frequencies, assume that the input signal frequency to be identified is 15 GHz. Furthermore, assume that the sampling frequency for the first measurement is 19.123 MHz and the sampling frequency for the second measurement is 10 kHz less, or 19.113 MHz.

An input signal frequency of 15 GHz, when sampled at 19.123 MHZ, will produce an IF frequency of 7.568 MHz (i.e., it is 7.568 MHz away from the 784th harmonic of 19.123 MHz). When 15 GHz is sampled at 19.113 MHz, the resulting IF signal frequency is 3.705 MHz (i.e., 3.705 MHz away from the 784th harmonic).

The function of the input signal identification method is to predict the input signal frequency (15 GHz) from measurements of the IF signal frequencies at various sampling frequencies. As calculated above, the first measurement yields an IF frequency of 7.568 MHz. Therefore, the first frequency list is comprised of the frequencies 7.568 MHz and −7.568 MHz. The second frequency list contains 3.705 MHz and −3.705 MHz. There are four possible pairings resulting in four possible input signal frequencies:

$F_1 = 7.568\ MHz;\ F_2 = 3.705\ MHz;$ $n = (3.705 - 7.568 + 19.113)\ MHz/10\ kHz = 1525;$ and first possible input signal frequency $= n^* 19.123\ MHz + F_1 = 29.170143\ GHz;$ or $F_1 = 7.568\ MHz;\ F_2 = -3.705\ MHz;$ $n = (-3.705 - 7.568 + 19.113\ )\ MHz/10\ kHz = 784;$ and second possible input signal frequency $= n \times 19.123\ MHz + F_1 = 15.000000\ GHz;$ or $F_1 = 7.568\ MHz;\ F_2 = 3.705\ MHz;$ $n = (3.705 - [7.568\ ])\ MHz/10\ kHz = 1127;$ and third possible input signal frequency $= n \times 19.123\ MHz + F_1 = 21.559189\ GHz;$ or $F_1 = -7.568\ MHz;\ F_2 = -3.705\ MHz;$ $n = (-3.705 - [-7.568\ ])\ MHz/10\ kHz = 386;$ and fourth possible input signal frequency $= n \times 19.123\ MHz + F_1 = 7.389046\ GHz$ Thereafter, the subroutine for elimination of frequencies is executed. At this juncture, there is a large list of potential input signal frequencies. In accordance with the frequency elimination subroutine, entries on this large list are eliminated by checking each listed frequency against the IF signal frequency lists of succeeding measurements.

Figure 10B:
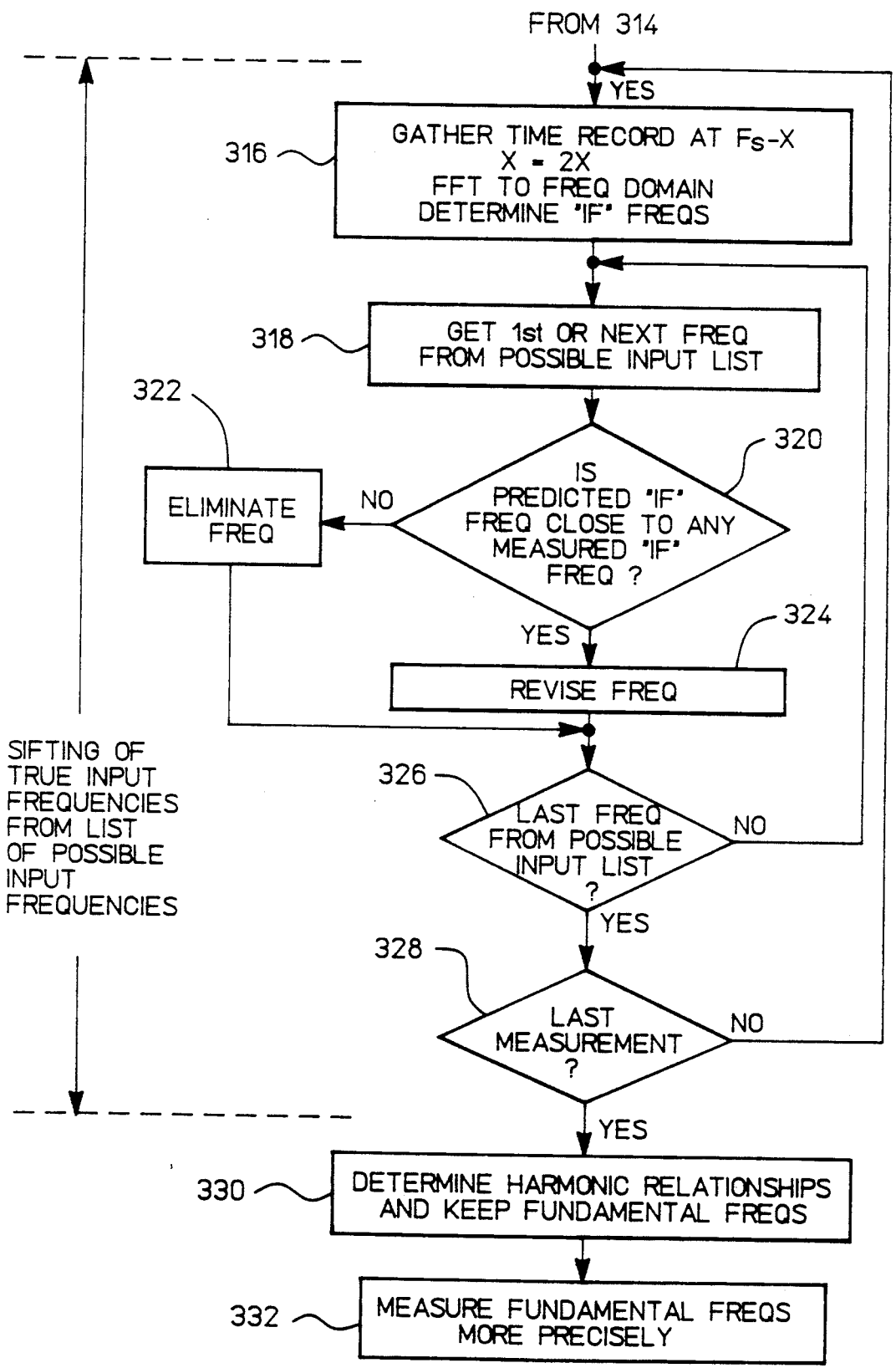

Therefore, an additional 10 to 14 measurements are performed, as indicated by the numeral 316 shown in FIG. 10B. However, if a more exhaustive input signal identification is needed, the number of additional measurements can be increased. Corresponding frequency lists are generated. However, the sampling frequencies selected for these additional measurements are stepped progressively farther away from the original sampling frequency $f_s$.

For example, as explained above, the first measurement was performed with a sampling frequency of $f_s$. The second measurement was performed with a sampling frequency of $f_s$ minus 10 kHz. These were the two measurements which generated the large frequency list.

The first succeeding measurement is performed with a sampling frequency of $f_s$ minus 20 kHz, the next with $f_s$ minus 40 kHz, the following with $f_s$ minus 80 kHz, etc. For each succeeding measurement, a predicted IF signal frequency is computed for each of the possible input signal frequencies, as shown by the step 316. These are checked against the actual IF signal frequencies measured, as indicated by the numerals 318 and 320 shown in FIG. 10B.

If there is no match, the possible input signal frequency is removed from further consideration, as indicated by the numeral 322 shown in FIG. 10B. If there is close agreement, the frequency from the initial large frequency list is modified slightly to reflect the most recent measurement, as indicated by the numeral 324 shown in FIG. 10B. If the predicted IF frequency is in close agreement with more than one actual IF frequency, an additional possible input signal frequency is generated and added to the list. This procedure is repeated until the predicted IF signal responses from all of the remaining possible input signal frequencies are compared with the measured IF frequencies from each of the subsequent measurement data sets, as indicated by the numerals 326 and 328 shown in FIG. 10B.

Continuing the above example to demonstrate the frequency elimination process, the list of potential input signal frequencies contains the following: 29.170143 GHz, 15.0 GHz (the actual input signal frequency), 21.559189 GHz, and 7.389046 GHz. The third measurement will employ a sampling frequency of 19.123 MHz minus 20 kHz, or 19.103 MHz. When the 15 GHz input signal frequency is sampled at this sampling rate, an IF frequency of 4.145 MHz results. The input signal identification method checks each of the possible input signal frequencies generated in the first portion of the procedure and rejects those which do not predict an IF signal frequency within a predetermined range of the measured 4.145 MHz.

Now, 29.170143 GHz, when sampled at 19.103 MHz, produces an IF frequency of 138 kHz. Also, 15.000000 GHz, when sampled at 19.103 MHz, produces an IF frequency of 4.145 MHz. Furthermore, 21.559189 GHz, when sampled at 19.103 MHz, produces an IF frequency of 8.098 MHz. Moreover, 7.389046 GHz, when sampled at 19.103 MHz, produces an IF frequency of 3.815 MHz.

Since 15 GHz is the only frequency in the list which corresponds to the measured IF frequency, the other three frequencies are eliminated, and the input signal identification method is complete. Multiple input signals and/or multiple harmonics of these signals typically require more measurements to completely sift the true input signal frequencies from the possible frequencies on the large frequency list that has been generated.

Thereafter, the subroutine for determining fundamental frequency components is executed. The frequencies remaining after the above process are first checked for duplicates (within a certain range) and then compared against each other to find harmonic relationships, as indicated by the numeral 330 shown in FIG. 10B. Preferably, if more than one fundamental frequency is identified, the sampling signal analyzer 10 preferably selects the one having the largest amplitude to analyze and lists the remaining fundamental frequencies whose analysis can be later selected by the operator. In some operating modes, only the fundamental frequencies are retained for display. Other operating modes are based on retaining the frequency components with the largest amplitudes irrespective of harmonic relationship.

Finally, the subroutine for precision measurement of fundamental frequencies is executed. With a very small list of fundamental frequencies (typically one), one additional measurement is performed, as indicated by the numeral 332 shown in FIG. 10B. The measurement size is very large for this measurement, for example, 4096 data points, so that the FFT has high resolution. The FFT resolution is preferably further enhanced by bin interpolation, as described in U.S. Pat. No. 4,686,457, to improve the accuracy of the frequency estimate.

One implementation of firmware for performing the input signal identification method appears in microfiche Appendix A. This is a C language version of the assembly language firmware executed by the DSP microprocessor 221A under control of the main microprocessor 241.

In the case of either a known or unknown input signal, the sampling signal analyzer 10 next determines where to mix the input signal in the IF based on the frequency of the input signal and a display time range selected for the sampling signal analyzer by the operator using the numeric keys on the control panel 28. The sampling signal analyzer 10 then generates a sampling signal oscillator frequency which is used to measure the fundamental and any harmonics which comprise the input signal and therefore reconstruct the wave form of the input signal, which can then be displayed.

The sampling frequency is selected so as to cause the fundamental and harmonic frequency components of the input signal to be translated to fundamental and harmonic frequency components of a much lower IF frequency. The higher-frequency spectrum is in effect frequency-translated into the IF spectrum for the particular input signal.

Figure 11:
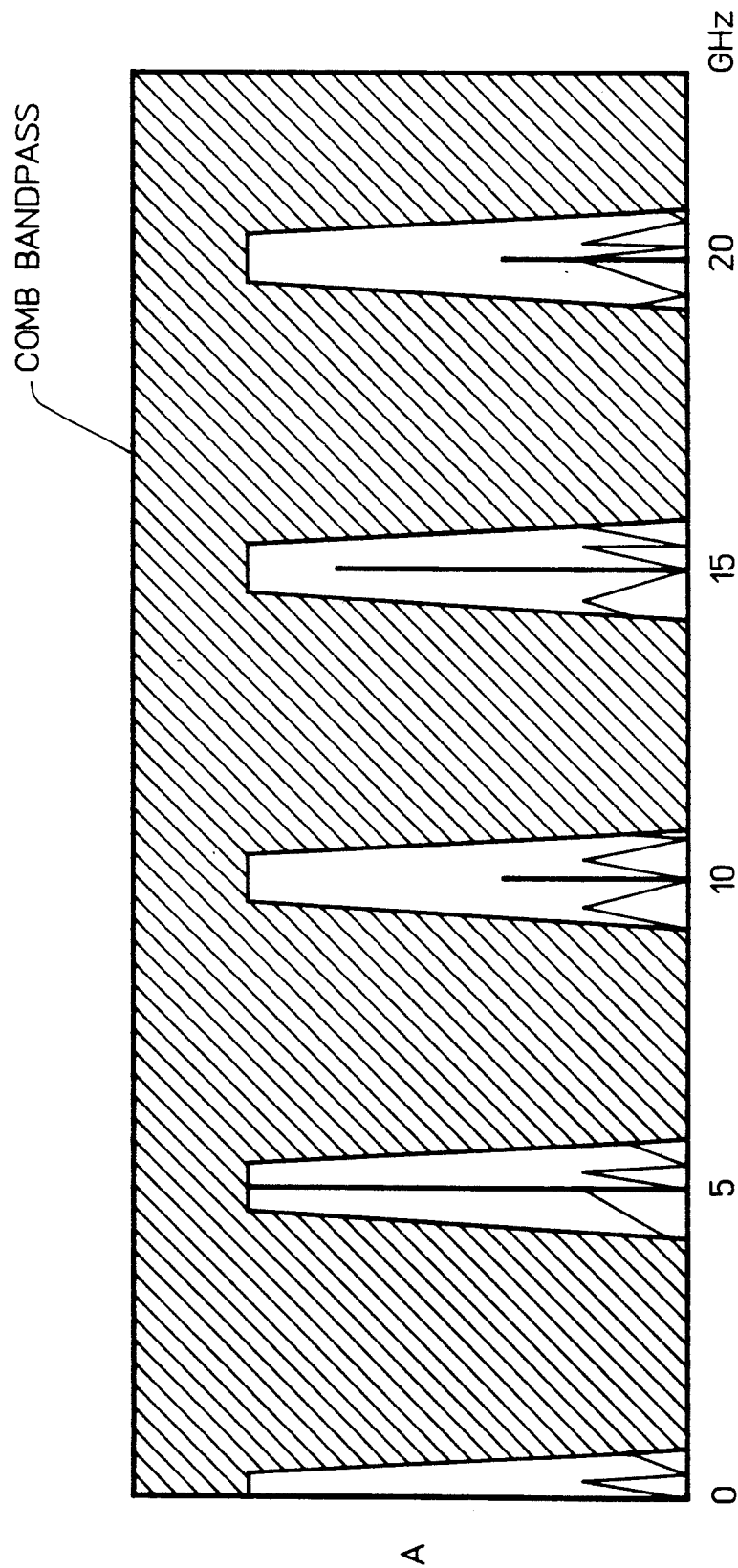
FIG. 11 illustrates a comb bandpass constructed in accordance with the invention.

At this juncture, the IF bandwidth can be narrowed so as to retain the translated fundamental and harmonic frequency components and reject signal responses which fall significantly away from any harmonic frequency of the SSO 16. This effect is referred to as a "comb bandpass," because the IF passband is effectively replicated at each of the harmonic frequencies of the SSO 16, as shown in FIG. 11. Signals which fall between these effective bandpass elements are rejected by the IF filters, such as the IF lowpass filter 185A, and will therefore not be digitized and displayed. Using a comb bandpass can be a powerful technique for increasing the signal to noise and removing unwanted contaminating signals.

For example, suppose that the desired IF frequency is 1 kHz. The sampling signal analyzer 10 will compute a frequency for the SSO 16 which will place one of its harmonics 1 kHz away from the fundamental of the input signal frequency of interest. If the fundamental frequency mixes with the 300th comb tooth to yield 1 kHz, the second harmonic of the signal will mix with the 600th comb tooth to yield 2 kHz, etc.

Control of the comb bandpass is accomplished by selecting the relationship of synthesized frequency and IF bandwidth. The ratio of synthesized frequency to IF bandwidth determines the amount of comb bandpass.

For example, assume that the IF bandwidth is 10 MHz. If the frequency of the SSO 16 is 20 MHz, then there are 20 MHz bandpasses (10 MHz on either side of each comb tooth) at 20 MHz spacing from 20 MHz to 20 GHz. Actually, any input signal frequency will mix somewhere into the IF. The IF signal can now be filtered by the IF lowpass filter 186A (100 kHz) to provide 200 kHz bandpasses at 20 MHz spacing from 0 Hz (DC) to 40 GHz, and any signals falling outside of the bandpasses will be ignored.

As described earlier, the trigger circuit 207A triggers measurement data storage in the RAM 204A. Triggering by the trigger circuit 207A is in response to the level (voltage) of the bandwidth-limited IF signal fed to the ADC 20A.

Therefore, in contrast to a conventional sequential sampling digitizing oscilloscope, the sampling signal analyzer 10 does not need a trigger circuit directly responsive to the level of the input signal to acquire a wave form at the proper timescale. Wave form acquisition in the sampling signal analyzer 10 is accomplished by the sampling circuit 141A which is continuously driven by the signal produced by the SSO 16. The trigger circuit 207A is responsive to the bandwidth-limited IF signal and is only used for aligning measurement data from sweep to sweep to provide a calibrated time axis. This task is performed in real time with a low-frequency analog trigger circuit responsive to the bandwidth-limited IF signal voltage.

A conventional sequential sampling digitizing oscilloscope requires a trigger signal produced directly in response to the input signal to acquire the wave form. If this trigger signal is noisy, the sequential sampling digitizing oscilloscope is unable to acquire the wave form, much less average the noise away. Noise in the input signal appearing at the input port 12A can similarly potentially degrade the efficacy of the trigger circuit 207A in the sampling signal analyzer 10.

Therefore, triggering in accordance with the invention can alternatively be based on the operator entering the trigger position for storage of measurement data in the RAM 204A based on the phase of the fundamental frequency of the input signal, rather than triggering based on the bandwidth-limited IF signal voltage. This is referred to as "phase triggering."

Figure 12:
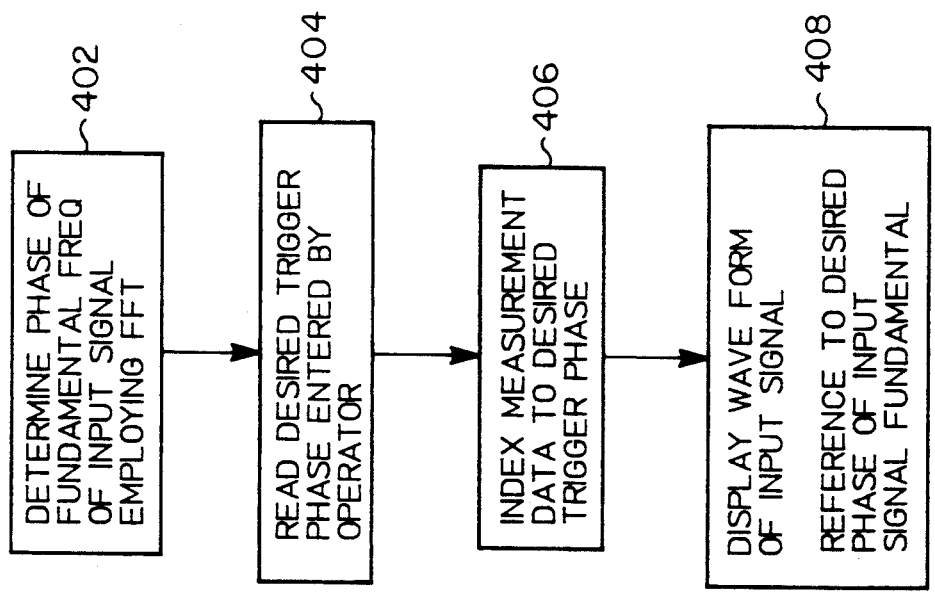
FIG. 12 is a flow chart of one embodiment of the phase triggering method in accordance with the invention.

Considered in more detail, the sampling signal analyzer 10 employs an FFT to determine the phase of the fundamental frequency component of the input signal appearing at the input port 12A at the initial storage location of the memory array of measurement data, as indicated by the numeral 402 shown in FIG. 12. Since more than one period of the input signal is stored in this memory array, any portion of the wave form can be read and transmitted to the CRT display screen 26 once the beginning phase is known. Sweep to sweep, however, the wave form may be stored in the memory array at random phases.

When phase triggering is employed, the operator enters a desired trigger phase with respect to the fundamental frequency component of the input signal, and this phase trigger point is read by the main microprocessor 241 and communicated to the DSP microprocessor 221A, as indicated by the numeral 404 shown in FIG. 12. By measuring the phase and then indexing to the storage location of the memory array containing the desired phase of the wave form, as indicated by the numeral 406 shown in FIG. 12, the displayed signal is aligned to the desired trigger phase to maintain a constant phase trigger point, as indicated by the numeral 408 shown in FIG. 12.

The task of aligning the measurement data from sweep to sweep employing phase triggering can be performed in a batch mode as a post-processing operation by the FFT. An advantage of the batch mode is that a large amount of processing gain (noise reduction) can be applied to extract the phase trigger information. Known averaging techniques can then be employed to improve signal to noise.

Phase triggering employs numerical processing to align the traces sweep to sweep. Once the sweeps have been aligned, averaging is coherent and the noise will reduce. Averaging the time wave form is a powerful way to reduce noise on the input signal. Since the sampling signal analyzer 10 does not need a trigger based on a voltage to acquire the wave form when phase triggering is employed, a noisy wave form can nevertheless be accurately replicated.

One implementation of firmware for performing phase triggering appears in microfiche Appendix B. This is a C language version of the firmware executed by the main microprocessor 241.

It is possible to have input signals which cannot be readily identified, for example, pseudo random binary sequence (PRBS) signals have the appearance of noise in both the time and frequency domains. A conventional sequential sampling digitizing oscilloscope can trigger off the clock to observe the eye diagram. The sampling signal analyzer 10 can simply be loaded with the clock frequency for it to set the frequency of the SSO 16 to observe the eye diagram. It does not need the clock. For the PRBS class of input signals, the eye diagram can be produced, but it does not appear at the same position on the CRT display screen 26 from sweep to sweep if the recovered clock is not used to trigger the other channel. Conceptually, however, batch processing similar to that just described for aligning the fundamental phase can be used to align the traces from sweep to sweep.

In the time sweep mode, the operator also enters format information for the displayed measurement data which appears on the CRT display screen 26. The available display formats include real part versus time, phase versus time, magnitude versus time, and log magnitude versus time. Additionally, the numerical transformation from the time to frequency domain via the FFT for spectrum measurements can be employed as a format selection.

Also, in accordance with the invention, the sampling signal analyzer 10 can be provided with a method for assuring that the time per division automatically changes with the input signal frequency to maintain the same number of cycles on the CRT display screen 26. This is referred to as the "cycles mode."

Considered in more detail, when a conventional sequential sampling digitizing oscilloscope is used, the desired time per division is entered, and the oscilloscope holds that time per division irrespective of the frequency of the input signal being measured. For example, if the operator sets the time per division to be 1 nanosecond and measures a 1 GHz input signal, 10 periods of the wave form appear across the display screen (assuming that there are 10 divisions across the screen). If the input signal frequency then changes to 500 MHz, five periods appear on the display screen. Likewise, for frequency domain measurements, a spectrum analyzer maintains start and stop frequency adjustments irrespective of the frequency of the input signal being measured. For example, if the start frequency is set at 0 Hz (DC), the stop frequency is set at 5 GHz, and the input signal has a frequency of 500 MHz, the first 10 harmonics of the input signal appear on the display screen. If the input signal changes to a 1 GHz signal, only the first five harmonics appear on the display screen. The operator does not need to enter the input signal frequency in order to get the span (time or frequency) that is desired.

In contrast, in the cycles mode, the sampling signal analyzer 10 adjusts the span in proportion (either directly or inversely) to the input signal frequency. The cycles mode will be best understood with reference to operation of the sampling signal analyzer 10 in the stimulus/response setup, i.e., where the sampling signal analyzer is directly controlling a variable frequency source whose signal is applied as a stimulus to the input of a DUT with the output of the DUT being connected to the input port 12A.

For the time sweep mode, instead of entering time per division, a number of cycles, for example, two cycles, is entered by the operator. This will cause two periods of the wave form to appear across the CRT display screen 26 irrespective of the input signal frequency. Therefore, instead of having the time axis remain fixed and the wave form expanding and contracting as the input signal frequency changes, in the cycles mode, the number of periods remains fixed, and the time axis changes as the input signal frequency changes. The cycles mode allows the operator to observe changes in the shape of the wave form of the input signal as a function of frequency without constantly rescaling the time axis. That is, rescaling is automatic.

The cycles mode for axis rescaling is equally effective for frequency displays calculated as the Fourier transform of time sweeps via the FFT. Instead of entering start and stop frequencies in absolute hertz, the entry parameters are start and stop harmonic. For example, start at harmonic 0, and stop at harmonic 10. Now, as the input signal frequency changes, the frequency axis changes (it still reads out in "Hz"), but the wave form, in this case the spectral display, does not contract or expand. This allows the operator to observe the harmonics of a DUT as a function of frequency without constantly rescaling the frequency axis.

Additionally, the sampling signal analyzer 10 preferably has the frequency sweep mode. This mode is invoked by the operator sequentially depressing the "SWEEP" soft key followed by a "FREQUENCY" soft key.

In the frequency sweep mode, the sampling signal analyzer 10 operates similarly to a vector network analyzer system. Operation of a vector network analyzer system is described in more detail in U.S. Pat. No. 4,636,717.

The frequency sweep mode requires that a variable frequency source be connected to the microwave transition analyzer system 9 so that the source is phase locked to the reference oscillator 162. Step sweeping of the source is controlled by the sampling signal analyzer 10.

The signal produced by the variable frequency source is applied as a stimulus to the input of the DUT, as well as to the input port 12B of the sampling signal analyzer 10 to serve as a reference signal. The output of the DUT is connected to the input port 12A of the sampling signal analyzer 10. The sampling signal analyzer 10 can therefore measure absolute (channel 1) or ratioed (channel 1 divided by channel 2) responses of the DUT.

After the "FREQUENCY" soft key is depressed, the operator can enter start and stop frequencies for the sweep of the variable frequency source. The operator depresses a "START" soft key followed by entry of the start frequency value using the numeric keys on the control panel 28. Similarly, the operator depresses a "STOP" soft key followed by entry of the stop frequency value using the numeric keys. Alternatively, the operator can enter a "CENTER FREQUENCY" followed by a "SPAN" using appropriate soft keys and the numeric keys to define the sweep range.

In the frequency sweep mode, the operator also enters format information for the displayed measurement which appears on the CRT display screen 26. The available formats include real part versus frequency, phase versus frequency, magnitude versus frequency, and log magnitude versus frequency. Additionally, numerical transformation from the frequency to time domain via the FFT for reflectometry measurements can be employed as a format selection.

Finally, the sampling signal analyzer 10 preferably provides the power sweep mode. This mode is similar to the frequency sweep mode, except that a variable power source is provided, instead of a variable frequency source, and parameters that are set by the operator relate to power, rather than to frequency.

In the power sweep mode, the operator also enters format information for the display which appears on the CRT display screen 26. The available formats include real part versus power, phase versus power, magnitude versus power, and log magnitude versus power. Numerical transformation via the FFT is not an available format selection in this mode.

To facilitate an understanding of the data acquisition operation of the sampling signal analyzer 10, the block diagram and data acquisition operation of the sampling signal analyzer will be compared and contrasted with the block diagrams and acquisition of data in two known data sampling signal measurement instruments, namely, a sequential sampling digitizing oscilloscope and a vector network analyzer system. The sampling signal analyzer 10 has attributes of both these instruments, as well as additional attributes existing in neither.

First, there are various similarities between the block diagram of the sampling signal analyzer 10 and the block diagram of a conventional sequential sampling digitizing oscilloscope. The major similarities are as follows.

The path for the input signal in both block diagrams is similar. The input signal is routed to a sampler, and the sampled signal is fed to an ADC. The sampler is driven by special sampler drive circuits. Therefore, there are three basic similarities in the block diagrams of the sampling signal analyzer 10 and a conventional sequential sampling digitizing oscilloscope, namely, the input signal to be measured is fed directly to a sampler, the output of the sampler is routed to an ADC, and the sampler is driven by special sampler drive circuits.

However, with reference to the simplified block diagram of the sampling signal analyzer 10 shown in FIG. 4, the sampling signal analyzer lacks any trigger circuitry at the input, and, accordingly, there is only one path for the input signal. This is the first major difference between the sampling signal analyzer 10 and a sequential sampling digitizing oscilloscope, namely, there is no trigger circuitry in the high frequency input path of the sampling signal analyzer 10, whereas trigger circuitry is an essential component of an oscilloscope.

Another difference between the sampling signal analyzer 10 and a conventional sequential sampling digitizing oscilloscope is that the sampling signal analyzer uses the SSO 16 to provide the timed pulses to the sampler drive circuit. Moreover, the sampling signal analyzer 10 varies the frequency of the sampler drive pulses, for example, from 10 MHz to 20 MHz. Using this type of sampler drive enables the sampling signal analyzer 10 to achieve much better trigger jitter than a sequential sampling digitizing oscilloscope. Therefore, the second major difference between the sampling signal analyzer 10 and a sequential sampling digitizing oscilloscope is that the sampling signal analyzer uses the SSO 16 to drive the sampler, and the frequency of the sampler drive varies between 10 MHz and 20 MHz, whereas sampling in an oscilloscope is based on detection of a triggering level and a delay that is incrementally increased from sample to sample.

Yet another difference between the sampling signal analyzer 10 and a conventional sequential sampling digitizing oscilloscope is the manner in which acquired data is presented to the ADC. When a sequential sampling digitizing oscilloscope is triggered, a single data point is sampled and fed to the ADC. The sequential sampling digitizing oscilloscope then awaits the next trigger to acquire another data point. The process to acquire each data point requires approximately 0.1 millisecond. Therefore, to acquire 1,000 data points requires about 0.1 second, or 100,000 microseconds.

In contrast, when the sampling signal analyzer 10 begins to acquire data, an entire time record of data points is acquired. The frequency of the SSO 16 is set to a frequency, for example, between 10 MHz and 20 MHz. Even at the lowest frequency of 10 MHz, a data point is acquired every 100 nanoseconds. Therefore, for the sampling signal analyzer 10 to acquire the same 1,000 data points as a sequential sampling digitizing oscilloscope requires only 100E-9 times 1E3, or 100E-6 seconds (100 microseconds). This results in a faster update rate for the sampling signal analyzer 10. Therefore, a third major difference between the sampling signal analyzer 10 and a sequential sampling digitizing oscilloscope is that the sampling signal analyzer acquires an entire time record, while an oscilloscope acquires a single point.

The data acquisition operation of the sampling signal analyzer 10 and a network analyzer system will now be compared and contrasted. In a network analyzer system, a variable frequency source signal is input to a DUT and to a reference channel. The output of the DUT as it responds to the signal produced by the source is compared against the reference channel signal.

In one network analyzer system, the local oscillator frequency is set to maintain a constant IF frequency, which is determined by a reference input. If the IF frequency begins to change from the reference frequency, a phase lock circuit modifies the local oscillator frequency to maintain the IF frequency constant.

During measurement of a DUT response, the source frequency spans a range from a fixed start frequency to a fixed stop frequency to test the DUT over a given frequency range. As the source frequency begins to change, the phase lock circuit responds to maintain the IF frequency constant.

Alternatively, in another network analyzer system, the local oscillator frequency is set to slew from a start frequency to a stop frequency. As the local oscillator frequency changes, the phase lock circuit will change the source frequency to maintain the IF frequency constant.

In both network analyzer systems, the IF frequency remains constant. Accordingly, the IF path in a network analyzer system can be thought of as bandpass with a bandwidth less than 10 kHz. Measurements with network analyzer systems are accomplished by employing frequency translation. That is, the frequency of the input signal to be measured is translated into the frequency of the IF and bandwidth limited.

In contrast, in the sampling signal analyzer 10, the IF can be thought of as a lowpass from 0 Hz (DC) to 10 MHz, or less. Furthermore, measurements with the sampling signal analyzer 10 are accomplished by additionally employing frequency compression. That is, the sampling signal analyzer 10 frequency-compresses the entire frequency band from DC to 40 GHz into the bandwidth of the IF.

The key difference between the sampling signal analyzer 10 and a vector network analyzer system is that the sampling signal analyzer is a lowpass, wideband IF signal measurement instrument, which employs frequency translation and frequency compression for its measurements, and the vector network analyzer system is a bandpass, narrowband IF signal measurement instrument, which employs only frequency translation for its measurements.

In the area of measurements, known data sampling signal measurement instruments which translate a microwave input signal to a lower frequency, at which frequency the signal parameters are measured or observed, require a processing bandwidth (IF bandwidth) as great as the measurement bandwidth. However, the sampling signal analyzer 10, which frequency-translates and frequency-compresses the input signal with repetitive sampling techniques, requires very little processing bandwidth to provide the same measurement.

For example, sampling a 1 GHz continuous wave (CW) signal (fundamental with harmonics) at a sampling rate which places a harmonic of the sampling frequency at a 1 kHz offset from the 1 GHz fundamental frequency will frequency-translate and frequency-compress the first 40 harmonics (40 GHz of measurement bandwidth) into 40 kHz of processing bandwidth. Additionally, if wider processing bandwidth is available, the IF signal can be filtered (typically lowpass) to remove contaminating signal or noise components which are translated to IF frequencies outside of the region to which the input signal has been frequency-translated and frequency-compressed.

Now, repetitive sampling techniques are equally effective for modulated input signals, such as pulsed radio-frequency (RF) signals. For a conventionally triggered sequential sampling digitizing oscilloscope, the trigger signal must occur at a rate corresponding to the modulation repetition rate. In the case of the sampling signal analyzer 10, a sampling frequency must be chosen such that a harmonic (or fundamental), of the sampling frequency is slightly offset in frequency from the modulation repetition rate. Again, a key advantage of the sampling signal analyzer 10 over a sequential sampling digitizing oscilloscope is that the IF signal can be filtered (comb bandpass) to improve signal to noise and/or remove contaminating signals.

Since the sampling signal analyzer 10 employs repetitive sampling techniques which frequency-translate and frequency-compress a pulsed RF signal into the IF bandwidth for further processing, characterization of pulsed RF devices can be performed employing modulation bandwidths much greater than those possible with conventional pulsed network analyzer systems, since these rely on frequency translation techniques alone. The recoverable modulation bandwidth for the sampling signal analyzer 10 can be as wide as the RF input bandwidth, whereas for a pulsed network analyzer system, the recoverable modulation bandwidth is restricted to the IF bandwidth of the network analyzer.

Measuring fast turn-on or turn-off characteristics of pulsed RF devices requires faithful reproduction of wide bandwidth modulation. This is a measurement in which the sampling signal analyzer 10 has significant advantages. Like a conventional pulsed network analyzer system, the sampling signal analyzer 10 can also be configured to sweep the carrier frequency or carrier power at a particular (selectable) time delay into the pulse. Unlike a pulsed network analyzer system, however, measurements can be performed during the turn-on and turn-off transitions of very fast RF devices.

As mentioned previously, the sampling signal analyzer 10 acquires a trace over a desired time range by knowing or identifying the input signal frequency and synthesizing a sampling signal oscillator frequency which precesses the sampling instant across the input signal at a desired time increment. An alternative data acquisition method referred to as the "pulse profiling method" is also available in the sampling signal analyzer 10 and will now be described.

Figure 13:
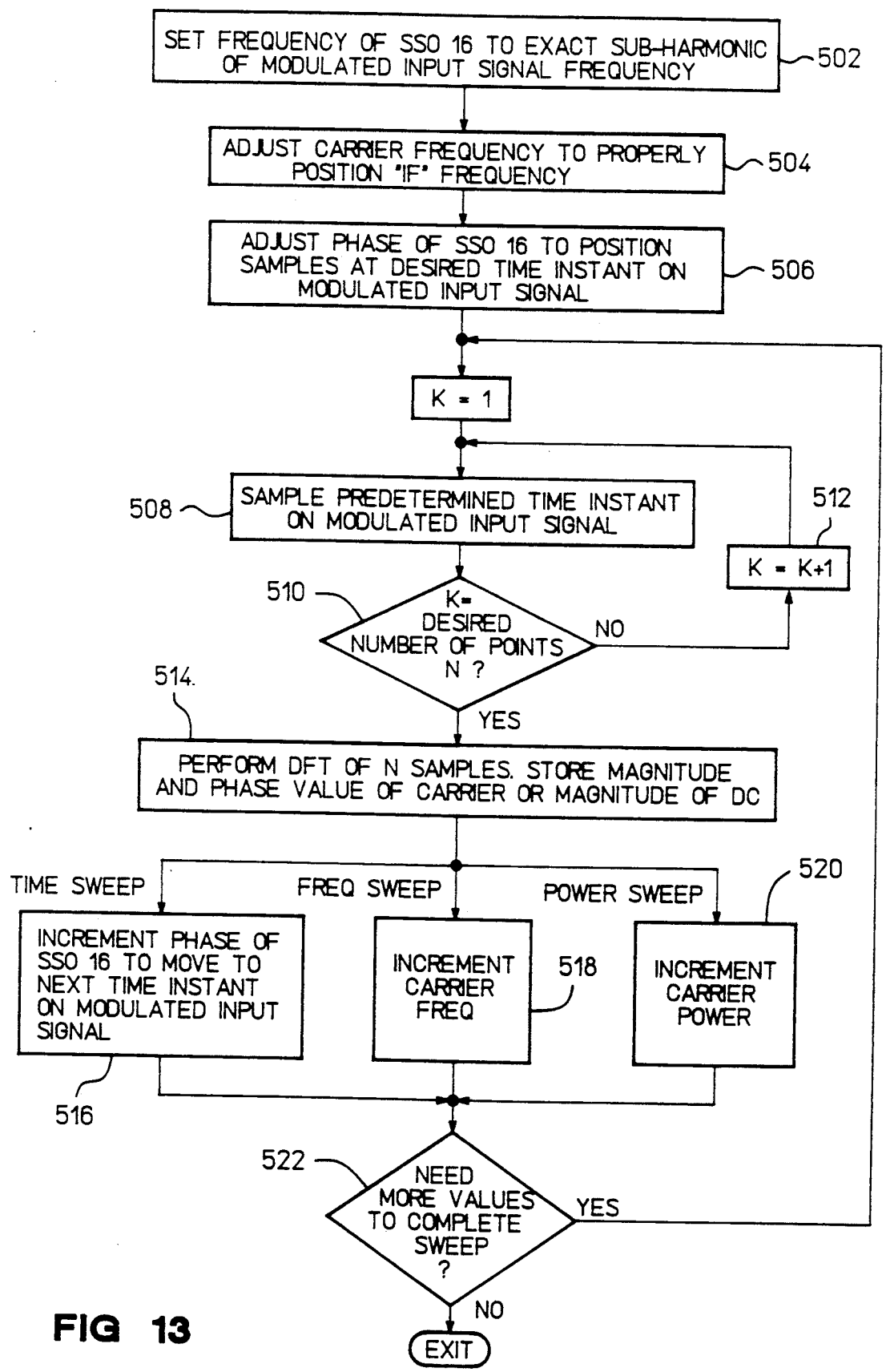
FIG. 13 is a flow chart of one embodiment of the pulse profiling method in accordance with the invention.

If the frequency of the SSO 16 is synthesized to be an exact sub-harmonic of the input signal frequency, as indicated by the numeral 502 shown in FIG. 13, the sampling instant will not precess through the input signal, but will continue sampling a particular time instant on the input signal, as indicated by the numerals 504, 506, 508, 510, and 512 shown in FIG. 13. Successive data samples can be filtered by a discrete Fourier transform (DFT) to extract the instantaneous signal voltage from noise or other non-coherent signals. The filtered result represents a single data point on the resulting time display, as indicated by the numeral 514 shown in FIG. 13. The amount of filtering is preferably adjustable by the operator by entering the equivalent filter bandwidth using the numeric keys on the control panel 28. This filter bandwidth value determines the desired number of samples, N, operated upon by the DFT, as shown by the step 510.

Precession from one time instant to the next on the input signal in the time sweep mode is then accomplished by a controlled phase shift of the SSO 16, as indicated by the numeral 516 shown in FIG. 13. This phase shift is employed to delay the sampling instant with respect to the input signal by a known amount. Once the sampling instant has been delayed, the filtering process can be initiated again, and the resulting filtered value can be stored as the next point to be displayed. The process is repeated until the entire trace is acquired, as indicated by the numeral 522 shown in FIG. 13.

The initial phase offset between the SSO 16 and the input signal is unknown. Therefore, a procedure to align the phase of the signal produced by the SSO 16 so as to shift the sampling point to the instant in time on the input signal at which the voltage is crossing a pre-assigned "IF trigger voltage" is performed, as shown by the step 506. This can be performed as an iterative search in which the measured voltage at each sampling instant is compared against the "IF trigger voltage," at which juncture the phase of the SSO 16 is decremented or incremented by a small amount to move the sampling instant forward or backward in time with reference to the input signal.

The pulse profiling method is particularly useful for the characterization of devices stimulated by pulsed RF signals, or, in general, modulated signals. For these signals, the frequency of the SSO 16 is synthesized to be an exact sub-harmonic of the input repetition rate (modulation rate). This forces the sampling instant to remain fixed at a particular point on the modulating envelope.

The pulse profiling method requires that the carrier frequency not be an exact harmonic of the modulation frequency. When the sampling signal analyzer 10 is configured with a synthesized source in a stimulus/response setup, the carrier frequency will be automatically adjusted so that this requirement is maintained, as shown by the step 504.

If the carrier were at a frequency that was an exact multiple (or harmonic) of the modulating rate, the sampling instant would repeatedly sample the same phase of the carrier wave form. Since this is not the case, the carrier frequency precesses in phase between the sampling instants enabled by the SSO 16. Therefore, although the sampling instants remain fixed in time with respect to the modulation envelope, successive data samples reflect a fixed precession of phase on the carrier. In other words, the acquired data represent a sampled sinusoid.

The magnitude and phase of this sinusoid is then determined. This is accomplished by performing the DFT on the sampled data values, as shown by the step 514. In the time sweep mode, once the magnitude and phase of the carrier frequency are determined at a particular point in time with reference to the modulating envelope, the phase of the SSO 16 is shifted a controlled amount to move the sampling instant along the modulating envelope the desired amount.

The number of data samples (N) applied to the DFT (i.e., the amount of filtering applied to the data) is preferably adjustable by the operator. It should be pointed out that the DFT need not only be employed to determine the magnitude and phase characteristics of the carrier frequency, but can instead be tuned to a harmonic of the carrier frequency (harmonic sweep) or to DC (to measure baseband leakage or "video feed-through" on the pulse).

It should also be pointed out that because the DFT is a filtering operation, the pulse profiling method can be useful for filtering away undesirable artifacts. For example, baseband leakage or carrier harmonics, which would otherwise appear in a typical sequentially sampled data acquisition, are filtered out.

The pulse profiling mode of operation can also be used for the frequency and power sweep modes when pulsed RF signals are employed as the stimulus. The only difference in operation is that at the end of each magnitude and phase determination, the phase of the SSO 16 is not changed. The reason that the phase is changed in the time sweep mode is to move the sampling instant with respect to the modulation envelope. In the frequency and power sweep modes, the sampling instant is held fixed with respect to the modulating envelope. Instead, the carrier frequency or carrier power is incremented (or decremented) at the end of each magnitude and phase determination, as indicated by the numeral 518 or 520 shown in FIG. 13.

One implementation of firmware for performing pulse profiling appears primarily in microfiche Appendix C, although portions of the firmware also appear in microfiche Appendix B. The combined firmware is a C language version of the firmware executed by the main microprocessor 241 and assembly language firmware executed by the DSP microprocessor 221A.

In summary, there are only a few tools that are in use to analyze microwave signals: power meters, counters, spectrum analyzers, and sequential sampling digitizing oscilloscopes. Consider the analysis of a 6 GHz input signal with as many as three harmonics and what the existing tools can determine about the input signal. Assume that these instruments have a 40 GHz bandwidth.

The power meter can measure how much total combined power is at the input, both in the fundamental and harmonics. It cannot determine the fundamental frequency, if there are harmonics, or the wave shape. It has poor sensitivity, since noise is proportional to bandwidth and so the power meter responds to 40 GHz of noise at its input.

The counter can determine that the input is at 6 GHz. It will not indicate the amplitude, that there are harmonics, or the wave shape. The counter also has low sensitivity, since it responds to the full 40 GHz of noise.

The spectrum analyzer presents a display of amplitude versus frequency. From this, a determination can be made of what is the input signal fundamental frequency, that there are harmonics, and their amplitudes. It will not display the wave shape, since it cannot measure the fundamental and harmonics simultaneously nor can it measure phase. It has good sensitivity, since the noise to which it responds is only the noise in its resolution bandwidth, which can be made small.

The sequential sampling digitizing oscilloscope can display the wave shape. From this, newer models can determine the frequency. It can also show the harmonics and their amplitudes by employing an FFT. However, input sensitivity is poor, because it responds to the full 40 GHz of noise at its input. Even worse, a sequential sampling digitizing oscilloscope needs a large trigger input, but even then it still will not trigger on a high-frequency input.

Suppose, however, that the situation is complicated by the addition of a 5 GHz signal at the input. Now, the power meter reads the combined power, which is meaningless. The counter may read the frequency of the larger signal or provide no meaningful indication at all. The spectrum analyzer responds to the extra input and will show it in addition to the original signal, but it still cannot display the wave shape. The sequential sampling digitizing oscilloscope provides no meaningful indication, since it cannot trigger on multiple input signals.

In contrast, instead of being subjected to all 20 GHz of noise like all of the instruments (except the spectrum analyzer), which results in poor sensitivity, and instead of having only one bandpass filter like a spectrum analyzer, which prevents acquiring the relative phase of the harmonics so that the wave shape can be derived, the sampling signal analyzer 10 effectively acquires the input signal, including all fundamental frequencies and their harmonics, and displays the wave form. The table below summarizes the comparative characteristics of these instruments.

|  | Freq. | Ampl. | Hrmncs. | Sens. | Mult. Inpts. | Wave Form Dsply. |
| --- | --- | --- | --- | --- | --- | --- |
| Pwr. Mtr. | N | Y | N | Poor | N | N |
| Counter | Y | N | N | Poor | N | N |
| Smp. Oscp. | Y | Y | Y | Poor | N | Sgl. Inpt. Only |
| Spct. Anly. | Y | Y | Y | Good | Y | N |
| Smp. Anly. 10 | Y | Y | Y | Good | Y | Y |

The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. A system for analyzing a repetitive non-band-limited input signal having a wave form, comprising:
   means for receiving the non-band-limited input signal;
   means for generating a plurality of periodic signals independent of receiving the input signal;
   means responsive to each of the plurality of periodic signals for sampling the input signal to frequency-translate and frequency-compress each frequency component of the input signal to an intermediate frequency signal so that all frequency components of the input signal are ordered in proper spectral sequence;
   means responsive to the intermediate frequency signal for bandwidth-limiting the intermediate frequency signal into a predetermined bandwidth; and
   means responsive to the bandwidth-limited intermediate frequency signal for manipulating the bandwidth-limited intermediate frequency signal while preserving phase relationship among fundamental and harmonically related frequency components contained in the intermediate frequency signal to reconstruct the wave form of the input signal.

2. The system of claim 1, further comprising:
   analog-to-digital conversion means for digitizing the bandwidth-limited intermediate frequency signal; and
   means for processing the bandwidth-limited intermediate frequency signal to determine amplitude and frequency of frequency components of the input signal without losing the phase relationship.

3. The system of claim 1 wherein the means for generating the plurality of periodic signals is a variable frequency source.

4. The system of claim 3 wherein the means for generating the plurality of periodic signals is a fractional-N synthesized source.

5. The system of claim 1 wherein the means responsive to the intermediate frequency signal is a variable bandwidth intermediate frequency lowpass filter.

6. The system of claim 1 wherein the means for manipulating comprises analog-to-digital conversion means for digitizing the bandwidth-limited intermediate frequency signal.

7. The system of claim 6, further comprising a display connected to the means for manipulating for displaying the reconstructed wave form of the input signal in a voltage versus time format.

8. The system of claim 2 wherein the means for processing performs a Fourier transform routine, and further comprising a display connected to the means for processing for displaying results of the Fourier transformation in an amplitude versus frequency format.

9. The system of claim 1 wherein the means for manipulating is repetitively enabled by a triggering signal derived from the bandwidth-limited intermediate frequency signal level.

10. The system of claim 6, further comprising memory means for storing digitized samples, wherein storage of the digitized samples is repetitively enabled by a triggering signal derived from the bandwidth-limited intermediate frequency signal level to enable selection of a variable amount of negative time.

11. The system of claim 7, further comprising memory means for indexing digitized samples based on a selected phase of the fundamental frequency of the input signal to enable display of the reconstructed wave form of the input signal.

12. The system of claim 2 wherein the means for generating the plurality of periodic signals is connected to the means for processing and the means for processing controls the frequency of the periodic signals to identify frequency components of the input signal.

13. The system of claim 12, further comprising means responsive to actuation by an operator for overriding the processing means for enabling analysis of an input signal frequency entered by the operator.

14. The system of claim 7, further comprising means responsive to actuation by an operator for displaying a selected number of cycles of the reconstructed input signal wave form.

15. The system of claim 8, further comprising means responsive to actuation by an operator for displaying a selected number of cycles of the reconstructed input signal wave form.

16. The system of claim 2, further comprising variable amplification and DC offset means for providing an optimum level for the bandwidth-limited intermediate frequency signal to the analog-to-digital conversion means.

17. The system of claim 6, further comprising variable amplification and DC offset means for providing an optimum level for the bandwidth-limited intermediate frequency signal to the analog-to-digital conversion means.

18. The system of claim 5 wherein the variable bandwidth intermediate frequency lowpass filter is narrowed to a bandwidth less than one-half the lowest of the frequencies of the plurality of periodic signals to construct a comb bandpass.

19. A method for measuring a non-band-limited modulated input signal having a known fundamental frequency, comprising the steps of:
  a) providing a variable frequency sampler drive signal;
  b) setting the frequency of the sampler drive signal to a substantially exact sub-harmonic of the known fundamental frequency of the non-band-limited modulated input signal;
  c) repetitively sampling a first time instant of the modulated input signal to produce a predetermined number of first data samples;
  d) filtering the predetermined number of first data samples;
  e) storing the filtered first data samples as a first data point;
  f) incrementing the phase of the sampler drive signal to provide a next time instant of the modulated input signal;
  g) repetitively sampling the next time instant of the modulated input signal to produce a predetermined number of next data samples;
  h) filtering the predetermined number of next data samples;
  i) storing the filtered next data samples as a next data point; and
  j) repeating steps f), g), h), and i) until a preselected number of data points has been stored to provide a time record of the modulated input signal.

20. A method for measuring a modulated input signal having a known carrier frequency, comprising the steps of:
  a) providing a variable frequency sampler drive signal;
  b) setting the frequency of the sampler drive signal to a substantially exact sub-harmonic of the known carrier frequency;
  c) repetitively sampling a preselected time instant of the modulated input signal to produce a predetermined number of first data samples;
  d) filtering the predetermined number of first data samples;
  e) storing the filtered first data samples as a first data point;
  f) incrementing the carrier frequency of the input signal to provide a modified modulated input signal;
  g) repetitively sampling the modified modulated input signal at the preselected time instant to produce a predetermined number of next data samples;
  h) filtering the predetermined number of next data samples;
  i) storing the filtered next data samples as a next data point; and
  j) repeating steps f), g), h), and i) until a preselected number of data points has been stored to provide a record of the modulated amplitude versus carrier frequency with respect to the preselected time instant.

21. A method for measuring a modulated input signal having a known fundamental frequency and having a variable power level, comprising the steps of:
  a) providing a variable frequency sampler drive signal;
  b) setting the frequency of the sampler drive signal to a substantially exact sub-harmonic of the known fundamental frequency;
  c) repetitively sampling a preselected time instant of the modulated input signal to produce a predetermined number of first data samples;
  d) filtering the predetermined number of first data samples;
  e) storing the filtered first data samples as a first data point;

f) incrementing the power of the modulated input signal to provide a modified modulated input signal;

g) repetitively sampling the modified modulated input signal at the preselected time instant to produce a predetermined number of next data samples;

h) filtering the predetermined number of next data samples;

i) storing the filtered next data samples as a next data point; and j) repeating steps f), g), h), and i) until a preselected number of data points has been stored to provide a record of the modulated amplitude versus power with respect to the preselected time instant and known fundamental frequency.

* * * * *

UNITED STATES PATENT AND TRADEMARK OFFICE
CERTIFICATE OF CORRECTION

PATENT NO. : 5,162,723

DATED : November 10, 1992

INVENTOR(S) : Michael S. Marzalek, et al.

It is certified that error appears in the above-identified patent and that said Letters Patent is hereby corrected as shown below:

Column 18, Line 59, "4xN1XN2." should read -- 4*N1*N2. --

Column 19, Line 10, "2xN1." should read -- 2*N1, --

Column 19, Line 11, "2xN2." should read -- 2*N2. --

Column 19, Line 16, "nxf$_s$+f$_i$ ," should read -- n*f$_s$+f$_i$, --

Column 19, Line 17, "2xN1" should read -- 2*N1 --

Column 19, Line 27, "2xN2" should read -- 2*N2 --

Column 19, Line 34, "2xN2" should read -- 2*N2 --

Column 19, Line 35, "2x2N1" should read -- 2*N1 --

Column 19, Line 37, "4xN1xN2" should read -- 4*N1*N2 --

Column 19, Line 43, "nxF$_s$+F$_1$," should read -- n*F$_s$+F$_1$, --

Column 19, Line 57, "nx10KHZ" should read -- n*10 kHz --.

Column 19, Line 57, "nx10" should read -- n*10 --

UNITED STATES PATENT AND TRADEMARK OFFICE
CERTIFICATE OF CORRECTION

PATENT NO. : 5,162,723
DATED : November 10, 1992
INVENTOR(S) : Michael S. Marzalek, et al It is certified that error appears in the above-indentified patent and that said Letters Patent is hereby corrected as shown below:

Column 20, line 48, "h x19.123" should read --n*19.123 --.

Column 20, line 55, "nx19.123 MHz" should read --n*19,123 MHz --.

Column 20, line 62, "nx19.123 MHz" should read --n*19.123 MHz --.

Signed and Sealed this

Twenty-eighth Day of December, 1993

Attest:

BRUCE LEHMAN

Attesting Officer     Commissioner of Patents and Trademarks